(12) United States Patent
Choi et al.

(10) Patent No.: US 8,420,432 B2
(45) Date of Patent: Apr. 16, 2013

(54) METHOD OF FORMING SEMICONDUCTOR DEVICE

(75) Inventors: Jong-Won Choi, Seongnam-si (KR); Jun-Seok Yang, Seoul (KR); Keon-Yong Cheon, Seoul (KR); Sung-Hyun Yoon, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 42 days.

(21) Appl. No.: 13/228,201

(22) Filed: Sep. 8, 2011

(65) Prior Publication Data

US 2012/0100658 A1 Apr. 26, 2012

(30) Foreign Application Priority Data

Oct. 22, 2010 (KR) .................. 10-2010-0103256

(51) Int. Cl.
*H01L 31/18* (2006.01)
*H01L 21/8234* (2006.01)

(52) U.S. Cl.
USPC ............... 438/59; 438/73; 438/239; 438/393; 257/E21.616

(58) Field of Classification Search .............. 438/59, 438/73, 239, 393; 257/E21.616
See application file for complete search history.

(56) References Cited

U.S. PATENT DOCUMENTS

| 6,074,907 | A  | * | 6/2000  | Oh et al. ................ 438/239 |
| 6,204,105 | B1 | * | 3/2001  | Jung ..................... 438/238 |
| 6,936,520 | B2 | * | 8/2005  | Yamanoue et al. ........ 438/383 |
| 7,361,542 | B2 |   | 4/2008  | Shim |
| 7,429,507 | B2 | * | 9/2008  | Ohkawa .................. 438/239 |
| 2006/0057760 | A1 |   | 3/2006  | Yi et al. |
| 2008/0305572 | A1 |   | 12/2008 | You et al. |

FOREIGN PATENT DOCUMENTS

| JP | 2006-086527 | 3/2006 |
| JP | 2006-191054 | 7/2006 |
| KR | 10-0614650  | 3/2006 |
| KR | 10-0606908  | 7/2006 |
| KR | 10-0885494  | 12/2008 |

* cited by examiner

Primary Examiner — Angel Roman
(74) Attorney, Agent, or Firm — F. Chau & Associates, LLC

(57) ABSTRACT

Provided is a method of forming a semiconductor device. The method includes forming an insulating film on a semiconductor substrate, a conductive film on the insulating film, and a first structure and a second structure on the conductive film. The semiconductor substrate has first and second regions. The first and second structures are formed on the first and second regions, respectively. An impurity diffused region is formed in the semiconductor substrate using the first structure as a mask. The impurity diffused region overlaps the first structure. A portion of the first structure, and the conductive film are etched to respectively form a gate structure and a capacitor structure on the first and second regions.

20 Claims, 20 Drawing Sheets

METHOD OF FORMING SEMICONDUCTOR DEVICE

CROSS-REFERENCE TO RELATED APPLICATION

This application claims priority under 35 U.S.C. §119 to Korean Patent Application No. 10-2010-0103256 filed on Oct. 22, 2010, the disclosure of which is hereby incorporated by reference in its entirety.

BACKGROUND

1. Field

The embodiments of the inventive concept relate to methods of forming a semiconductor device, and more particularly, to methods of forming an impurity diffused region and a gate structure in a semiconductor device.

2. Discussion of Related Art

A semiconductor device, such as image sensor, has been fabricated by including a photodiode in a semiconductor substrate and a gate structure on the semiconductor substrate. The photodiode may convert natural light received from the exterior of the image sensor into an electrical signal. The gate structure may be disposed adjacent to the photodiode, and may exhibit electrical characteristics of the image sensor using electrical signals of the photodiode.

During a process for manufacturing a semiconductor device, the photodiode may be formed after formation of the gate structure. The photodiode may be formed by implanting impurity ions into the semiconductor substrate using the gate structure as a mask. Thus, the photodiode may be influenced by a profile of the gate structure. Also, the profile of the gate structure may be influenced by the process environment for forming the gate structure.

In the event that the gate structure has an inadequate profile, the photodiode, being influenced by the profile of the gate structure, may have an inadequate junction profile that does not meet a wanted range. An inadequate junction profile of the photodiode may deteriorate electrical characteristics of the gate structure during operation of the semiconductor device. The photodiode and the gate structure may also deteriorate electrical characteristics of the semiconductor device. Also, if the semiconductor device is disposed in an information processing system, the information processing system may malfunction due to the deterioration of electrical characteristics of the semiconductor device.

SUMMARY

Example embodiments of the inventive concept provide a method of forming a semiconductor device such as an image sensor.

Example embodiments of the inventive concept further provide an information processing system including a semiconductor device such as an image sensor.

In accordance with example embodiments, a method of forming a semiconductor device comprises preparing a semiconductor substrate including a first region and a second region. A first insulating film and a first conductive film on the first insulating film are formed on the semiconductor substrate. A first structure is formed on the first conductive film in the first region. A second structure is formed on the first conductive film in the second region. A first mask pattern is formed to have an opening exposing at least part of the first conductive film in the first region and the first mask pattern is formed on the first structure and the second structure. Impurity ions are implanted to penetrate the first insulating film and the first conductive film into the semiconductor substrate using the first mask pattern as a mask, thereby forming an impurity diffused region in the semiconductor substrate in the first region. The first mask pattern is removed from the semiconductor substrate. A second mask pattern is formed on the second structure, leaving part of the first conductive film and the first structure exposed. The exposed part of the first conductive film, and a portion of the first structure are etched using the second mask pattern as an etch mask to form a gate structure in the first region. The second mask pattern is removed from the semiconductor substrate to form a capacitor structure in the second region.

The first insulating film may include silicon oxide.

The first conductive film may include silicon.

Each of the first structure and the second structure may include a second insulating film and a second conductive film sequentially stacked on the first conductive film.

The second insulating film may include silicon oxide and silicon nitride.

The second conductive film may include silicon.

The etching of the portion of the first structure may include removing the second conductive film to leave the second insulating film.

The first mask pattern may include a photoresist pattern, and may further include a hard mask pattern.

The hard mask pattern may be formed on an upper portion of each of the first structure and the second structure.

The hard mask pattern may include silicon oxide, silicon nitride or silicon oxynitride.

The method may further comprise forming spacers on sidewalls of the gate structure and the capacitor structure.

The forming of the spacer may include forming a third insulating film covering the gate structure and the capacitor structure, and etching the third insulating film.

The gate structure may be formed of an etched first conductive film, and a remaining portion of the first structure.

The first region may be an active pixel sensor (APS) array region, the second region may be a correlated double sampling (CDS) region, the impurity diffused region may be a photodiode, and the gate structure may be a transfer gate structure.

The opening in the first mask pattern may expose a portion of a top surface of the first structure.

In accordance with example embodiments, a method of forming a semiconductor device comprises preparing a semiconductor substrate including first, second and third regions. A first insulating film and a first conductive film on the first insulating film are formed on the semiconductor substrate. A first structure is formed on the first conductive film in the first region. A second structure is formed on the first conductive film in the second region. A first mask pattern is formed to have an opening so as to expose at least part of the first conductive film on the first region and the first mask pattern is formed on the first structure and the second structure. Impurity ions are implanted to penetrate the first insulating film and the first conductive film into the semiconductor substrate using the first mask pattern as a mask, thereby forming an impurity diffused region in the first region. The impurity diffused region functions as a photodiode of the semiconductor device. The first mask pattern is removed from the semiconductor substrate, and a second mask pattern is formed on the second structure, and on a portion of the first conductive film in the third region, leaving part of the first conductive film and the first structure exposed. The exposed part of the first conductive film, a portion of the first structure and the second mask pattern are sequentially removed to form a transfer gate structure on the first region and a capacitor structure on the second region. Another gate structure is formed on the third region.

The first region may be an active pixel sensor array region, the second region may be a correlated double sampling region, and the third region may be a logic region.

The other gate structure may include a selected gate structure.

In accordance with example embodiments, a method of forming a semiconductor device comprises preparing a semiconductor substrate. A first insulating film is formed on the semiconductor substrate. A first conductive film is formed on the first insulating film. A second insulating film is formed on the first conductive film. A second conductive film is formed on the second insulating film. The second insulating film and the second conductive film are patterned to form a second insulating pattern and a second conductive pattern on the first conductive film. The second insulating pattern and the second conductive pattern constitute a first structure, and the first structure leaves part of the first conductive film exposed. Impurity ions are implanted into the semiconductor substrate to penetrate the first insulating film and the first conductive film using the first structure as a mask, thereby forming an impurity diffused region in the semiconductor substrate. The first insulating film and the second insulating pattern are exposed by removing the second conductive pattern, and the first conductive film around the second conductive pattern to form a gate structure. The gate structure includes a first conductive pattern and the second insulating pattern.

In accordance with example embodiments, a method of forming a semiconductor device comprises sequentially stacking a first insulating film, a first conductive film, a second insulating film, and a second conductive film on a semiconductor substrate including first and second regions, forming a first mask pattern on part of the second conductive film in the first and second regions, removing portions of the second conductive film, and of the second insulating film left exposed by the first mask pattern to form first and second structures on the first and second regions, the first and second structures each including a patterned portion of the second conductive film stacked on a patterned portion of the second insulating film, removing the first mask pattern, forming a second mask pattern on the first structure and the second structure, wherein the second mask pattern includes an opening exposing at least part of the first conductive film in the first region, implanting impurity ions into the semiconductor substrate through the opening using the second mask pattern as a mask, thereby forming an impurity diffused region in the first region of the semiconductor substrate, removing the second mask pattern from the semiconductor substrate, forming a third mask pattern on the second structure, leaving part of the first conductive film and the first structure exposed, etching the exposed part of the first conductive film, and a portion of the first structure using the third mask pattern as an etch mask to form a gate structure in the first region, and removing the third mask pattern from the semiconductor substrate to form a capacitor structure in the second region.

BRIEF DESCRIPTION OF THE DRAWINGS

The features of the inventive concept will be apparent from the more particular description of embodiments of the inventive concept, as illustrated in the accompanying drawings in which like reference characters may refer to the same parts throughout the different views. The drawings are not necessarily to scale, emphasis instead being placed upon illustrating the principles of the inventive concept. In the drawings.

DETAILED DESCRIPTION OF THE EMBODIMENTS

Figure 1:
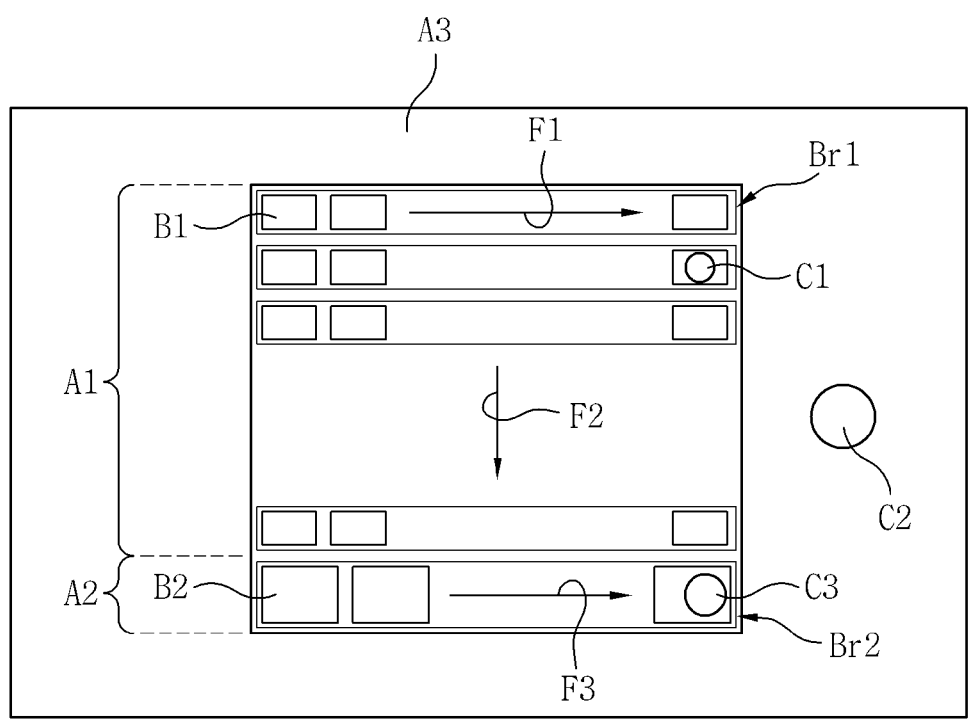
FIG. 1 is a layout view showing a semiconductor device such as an image sensor according to an example embodiment of the inventive concept.

Various example embodiments will now be described more fully with reference to the accompanying drawings in which some example embodiments are shown. It should be understood that the example embodiments are not necessarily limited to the particular forms disclosed, and may cover all modifications, equivalents, and alternatives falling within the scope of the inventive concept.

In the drawings, the thicknesses of layers and regions may be exaggerated for clarity, and like numbers may refer to like elements throughout the description of the figures.

It will be understood that, if an element is referred to as being "connected" or "coupled" to, or "on" another element, it can be directly connected, or coupled to, or "on" the other element or intervening elements may be present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Methods of forming an image sensor according to example embodiments of the inventive concept will be described in further detail by referring to the accompanying drawings.

FIG. 1 is a layout view showing a semiconductor device such as an image sensor according to an example embodiment of the inventive concept.

Referring to FIG. 1, an image sensor 170 comprises first to third regions A1, A2 and A3. The first region A1 corresponds to an active pixel sensor (APS) array region of the image sensor 170. The first region A1 comprises first unit blocks B1 and first unit block rows Br1. The first unit blocks B1 arrayed along a first arrow F1 constitute a first unit block row Br1.

The first unit block rows Br1 arrayed along a second arrow F2 constitute the first region A1. The second region A2 corresponds to a correlated double sampling (CDS) region of the image sensor 170. The second region A2 comprises second unit blocks B2 and second unit block rows Br2. The second unit blocks B2 arrayed along a third arrow F3 constitute a second unit block row Br2.

The third region A3 corresponds to a logic region of the image sensor 170. The third region A3 surrounds the first and second regions A1 and A2. The third region A3 outputs data from the first unit blocks B1.

Figure 2:
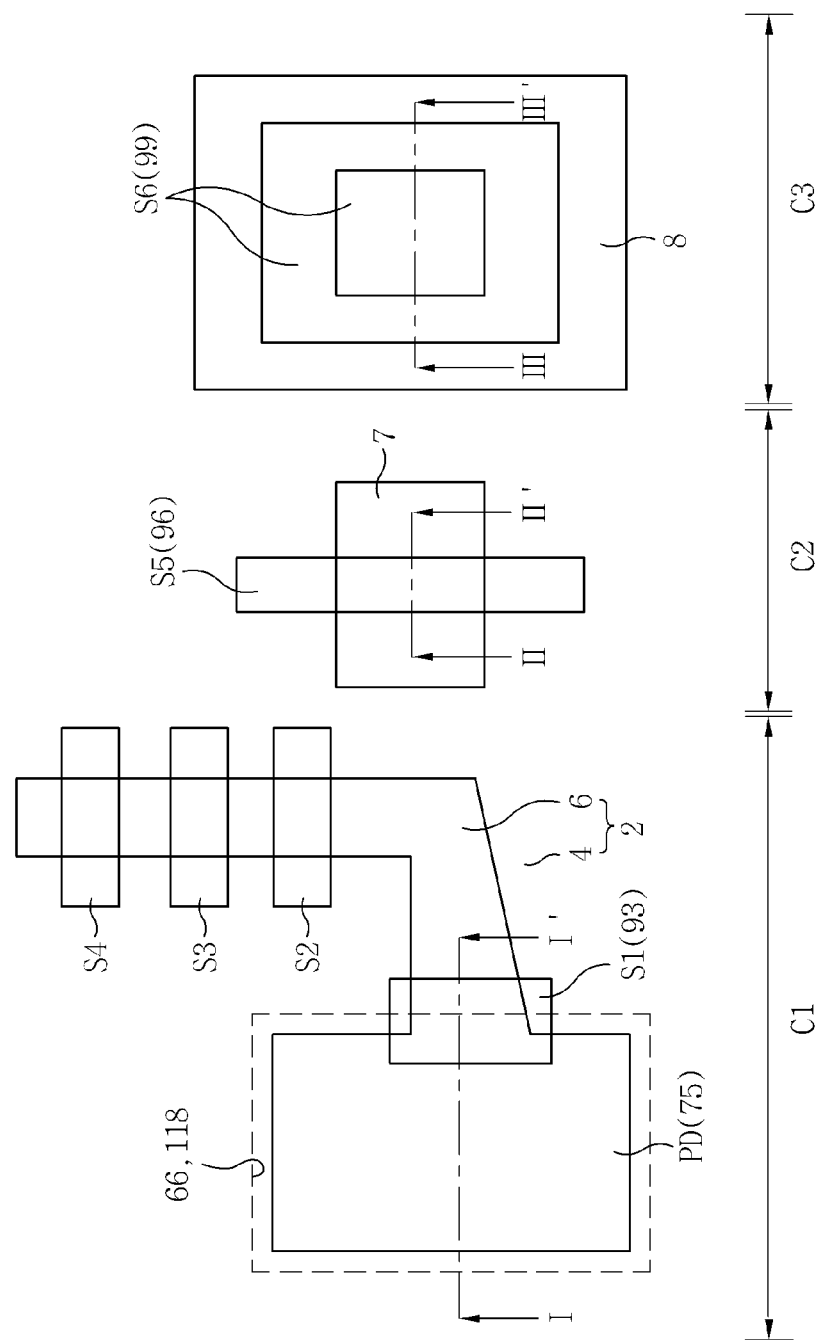
FIG. 2 is an enlarged view showing check regions C1, C2 and C3 of FIG. 1 according to example embodiments of the inventive concept.

FIG. 2 is an enlarged view showing check regions C1, C2 and C3 of FIG. 1 according to example embodiments of the inventive concept. The first check region C1 is disposed in the first region A1 of FIG. 1, the second check region C2 is disposed in the second region A2 of FIG. 1, and the third check region C3 is disposed in the third region A3 of FIG. 1.

Referring to FIG. 2, the first check region C1 comprises a photodiode (PD) (also referenced as 75), a transfer gate structure S1 (also referenced as 93), a reset gate structure S2, a sensing gate structure S3 and/or an access gate structure S4 on a semiconductor substrate 2 including an inactive region 4 and a first active region 6. The transfer gate structure S1 and the reset gate structure S2 constitute a transfer transistor and a reset transistor in the image sensor 170 of FIG. 1. The inactive region 4 is an isolation region defining at least one active region, such as a shallow trench isolation (STI) region.

The sensing gate structure S3 and the access gate structure S4 constitute a sensing transistor and an access transistor in the image sensor 170 of FIG. 1. The second check region C2 comprises a logic gate structure S5 (also referenced as 96) on a second active region 7. The logic gate structure S5 constitutes a logic transistor in the image sensor 170 of FIG. 1. The third check region C3 comprises a capacitor structure S6 (also referenced as 99) on a third active region 8.

Methods of forming an image sensor according to embodiments of the inventive concept are described referring to FIGS. 3 to 19. The methods are described in connection with the transfer gate structure S1, the logic gate structure S5 and the capacitor structure S6 of FIG. 2.

FIGS. 3 to 12 are cross-sectional views taken along lines I-I', II-II' and III-III' of FIG. 2, illustrating a method of forming an image sensor according to an embodiment of the inventive concept.

Figure 3:
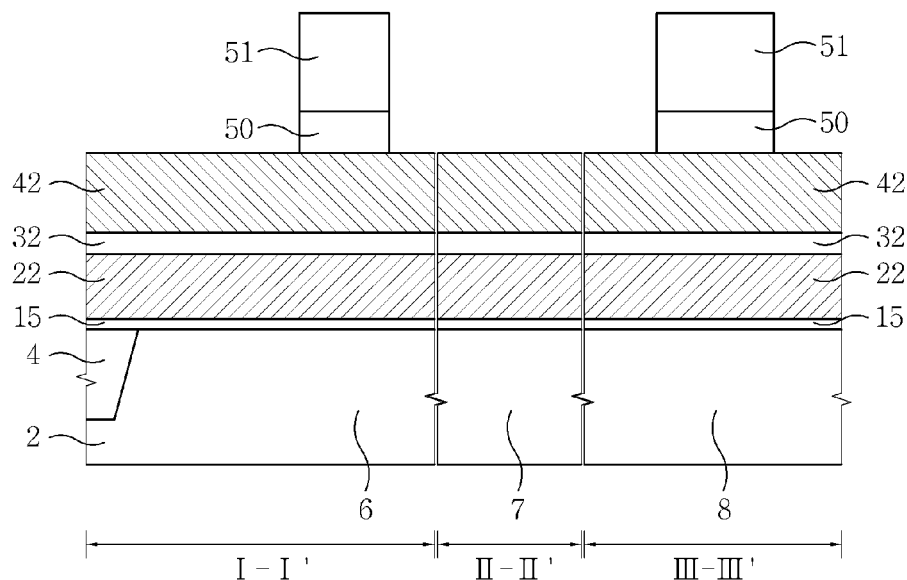
FIGS. 3 to 12 are cross-sectional views taken along lines I-I', II-II' and III-III' of FIG. 2, illustrating a method of forming an image sensor according to an embodiment of the inventive concept.

Referring to FIG. 3, a semiconductor substrate 2 is prepared. The semiconductor substrate 2 comprises, for example, at least one of monocrystalline silicon, polycrystalline silicon and silicon oxide. The semiconductor substrate 2 is conductive. An inactive region 4 is formed in the semiconductor substrate 2. The inactive region 4 defines first to third active regions 6, 7 and 8 as illustrated in FIG. 2.

The inactive region 4 comprises at least one insulating material. A first insulating film 15 is formed on the inactive region 4, and the first to third active regions 6, 7 and 8. The first insulating film 15 comprises, for example, silicon oxide or metal oxide. A first conductive film 22 is formed on the first insulating film 15. The first conductive film 22 comprises, for example, doped polysilicon, metal or metal silicide.

A second insulating film 32 is formed on the first conductive film 22. The second insulating film 32 comprises, for example, at least one of silicon oxide, metal oxide, silicon nitride and silicon oxynitride. The second insulating film 32 is formed of, for example, a double-layered film of a silicon oxide film and a silicon nitride film, a triple-layered film of a silicon oxide film, a silicon nitride film and a silicon oxynitride film, or a multi-layered film comprising a plurality of insulating films other than those mentioned above.

The second insulating film 32 comprises at least one insulating film having the same etching rate as or a different etching rate from the first insulating film 15. For ease of illustration, the second insulating film 32 is schematically shown as a single-layered insulating film, but is not limited thereto. A second conductive film 42 is formed on the second insulating layer 32. The second conductive film 42 may comprise the same material as the first conductive film 22.

First photoresist patterns 51 are formed on the second conductive film 42. The first photoresist patterns 51 are formed on the first and third active regions 6 and 8, respectively. A first photoresist pattern 51 of the first active region 6 may or may not be formed to correspond to each of the reset, sensing and access gate structures S2, S3, and S4. According to an embodiment, the first photoresist patterns 51 correspond to the transfer gate structure S1 and the capacitor structure S6 of FIG. 2.

In addition, according to an embodiment, hard mask patterns 50 are formed between the second conductive layer 42 and the first photoresist patterns 51. According to an embodiment, the hard mask patterns 50 comprise an insulating material having a larger thickness than each of the first and second insulating films 15 and 32, and have a different etching rate from the first and second insulating films 15 and 32. The hard mask patterns 50 may comprise, for example, silicon oxide, silicon nitride or silicon oxynitride.

Figure 4:
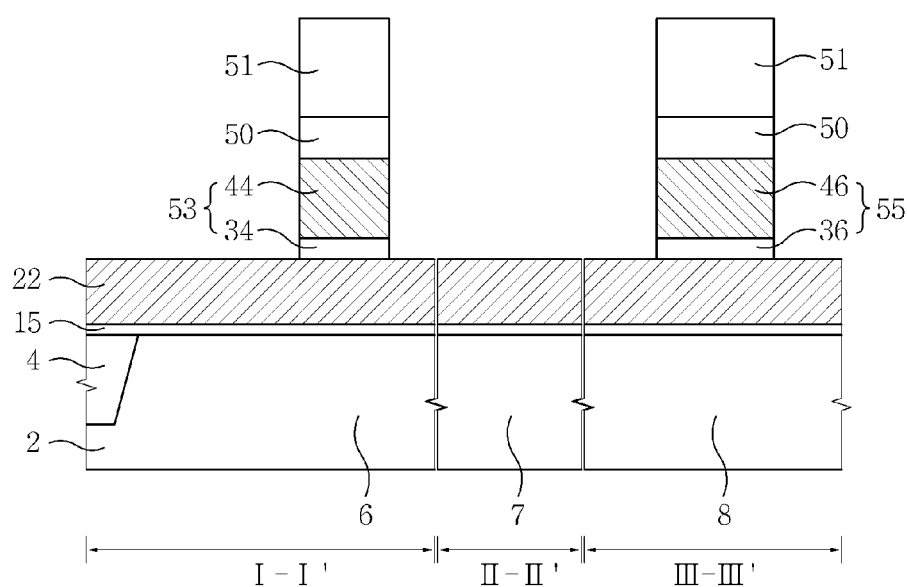

Referring to FIG. 4, the second insulating film 32 and the second conductive film 42 of FIG. 3 are etched using the first photoresist patterns 51 as an etch mask. During the etching of the second conductive film 42, the second insulating film 32 is used as an etch buffer layer. During the etching of the second insulating film 32, the first conductive film 22 is used as an etch buffer layer.

As such, first and second structures 53 and 55 are formed on the first conductive film 22. The first structure 53 comprises a second insulating pattern 34 and a second conductive pattern 44 sequentially stacked on the first active region 6. The second structure 55 comprises a second insulating pattern 36 and a second conductive pattern 46 sequentially stacked on the third active region 8.

According to an embodiment, the second insulating pattern 36 of the second structure 55 is the dielectric material of the capacitor structure S6 of FIG. 2. According to an embodiment, the second conductive pattern 46 of the second structure 55 functions as an upper electrode of the capacitor structure S6. Alternatively, as shown in FIG. 3, the second insulating film 32 and the second conductive film 42 are etched using both the hard mask patterns 50 and the first photoresist patterns 51 as etch masks.

Also, after removing the first photoresist patterns 51, the second insulating film 32 and the second conductive film 42 may be etched using the hard mask patterns 50 as an etch mask.

Figure 5:
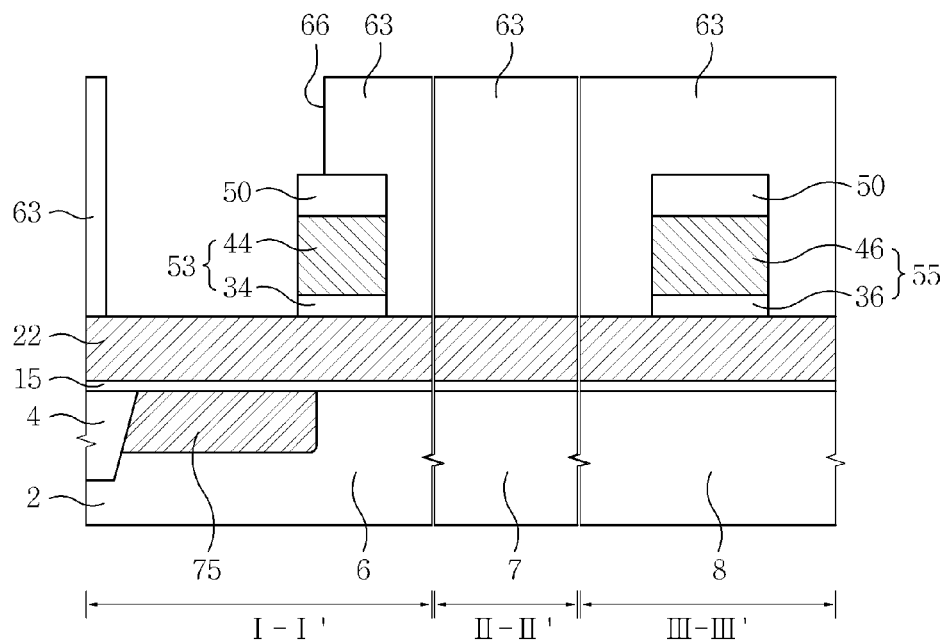

Referring to FIG. 5, a second photoresist pattern 63 is formed on the first conductive film 22, the first structure 53 and the second structure 55. The second photoresist pattern 63 has an opening 66 on the first active region 6. The opening 66 of the second photoresist pattern 63 exposes a top surface of the first conductive film 22 and a sidewall of the first structure 53.

According to an embodiment, when viewed from a plan view, an exposure area of the opening 66 of the second photoresist pattern 63 has a larger size than an area of the photodiode 75 (see FIG. 2). The opening 66 of the second photoresist pattern 63 exposes the first conductive film 22 and part of the first structure 53. Impurity ions are implanted in the semiconductor substrate 2 using the second photoresist pattern 63 as a mask so as to penetrate the first insulating film 15 and the first conductive film 22.

For example, the impurity ions may comprise phosphorus (P) or Arsenic (As). As such, a first impurity diffused region 75 is formed in the semiconductor substrate 2. The impurity ions are concentrated in the opening 66 using the first structure 53 and the second photoresist pattern 63 as a mask. According to an embodiment, the first impurity diffused region 75 has a different conductivity from the semiconductor substrate 2. Referring to FIG. 2, the first impurity diffused region 75 is formed in the first active region 6 on the left side of the transfer gate structure S1.

The first impurity diffused region 75 is the photodiode PD and is aligned with the first structure 53. Referring to FIG. 4, the impurity ions may also be implanted in the semiconductor substrate 2 through the first insulating layer 15 and the first conductive layer 22 using the hard mask patterns 50, in addition to the first structure 53 and the second photoresist pattern 63.

The hard mask patterns 50 further contribute to concentrating the impurity ions in the opening 66 of the second photoresist pattern 63. Subsequently, the second photoresist pattern 63 is removed from the semiconductor substrate 2.

Figure 6:
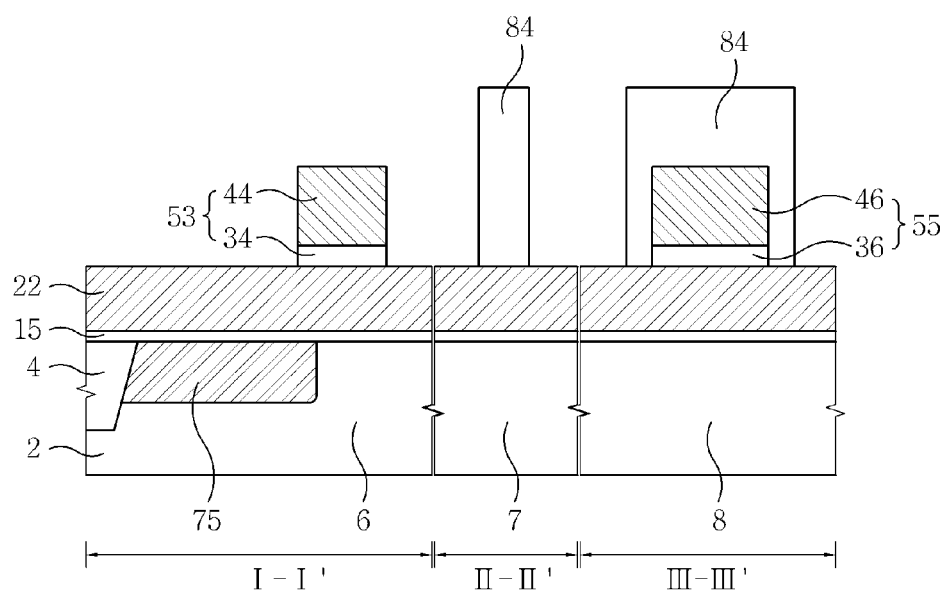

Referring to FIG. 6, third photoresist patterns 84 are formed on the first conductive film 22 and the second structure 55. The third photoresist patterns 84 are formed on the second and third active regions 7 and 8, respectively. In this case, a third photoresist pattern 84 of the second active region 7 selectively exposes the first conductive film 22.

Referring to FIG. 2, the third photoresist pattern 84 of the second active region 7 corresponds to the logic gate structure S5 (also referenced as 96). A third photoresist pattern 84 of the third active region 8 surrounds the second structure 55 to selectively expose the first conductive film 22. The third photoresist pattern 84 of the third active region 8 corresponds to the capacitor structure S6 (also referenced as 99).

As shown in FIG. 6, after removing the second photoresist pattern 63, the hard mask patterns 50 are removed from the semiconductor substrate 2. Subsequently, the third photoresist patterns 84 are formed on the first conductive film 22.

Figure 7:
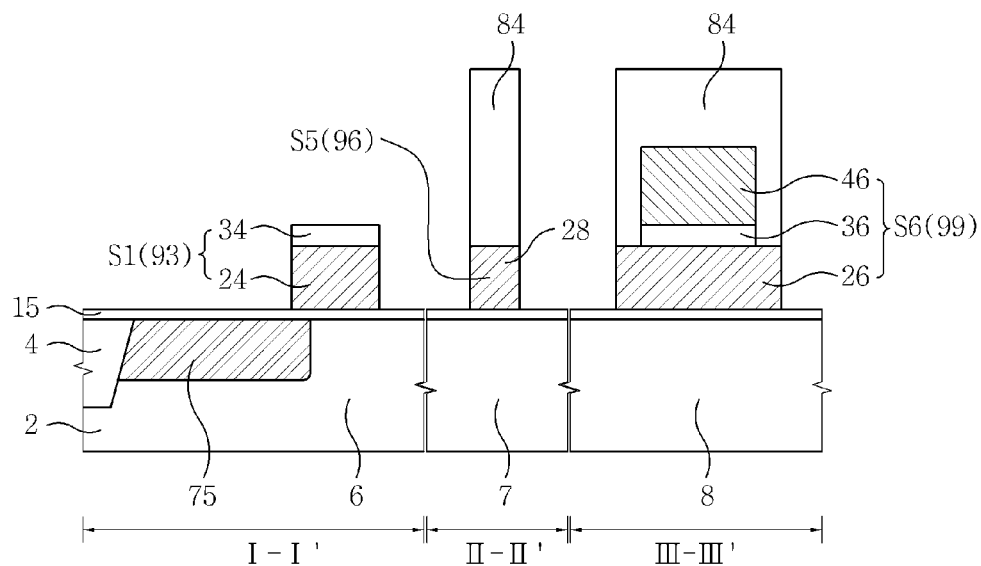

Referring to FIG. 7, the first conductive film 22 of FIG. 6 is etched using the first insulating film 15 and the third photoresist patterns 84 as an etch buffer layer and an etch mask, respectively. During the etching of the first conductive film 22, the second conductive pattern 44 of the first active region 6 of FIG. 6 is etched using the second insulating pattern 34 as an etch buffer layer.

During the etching of the first conductive film 22 and the second conductive pattern 44, the second insulating pattern 34 stabilizes a process environment of the etching process to improve pattern fidelity. More specifically, when performing the etching on the first active region 6, the second insulating pattern 34 blocks polymers generated from the third photoresist patterns 84, and a pattern-forming capability (or resolution) is improved using a relatively thin etch mask.

As a result, a transfer gate structure 93, a logic gate structure 96 and a capacitor structure 99 are formed on the first to third active regions 6, 7 and 8, respectively, as shown in FIGS. 2 and 7. The transfer gate structure 93 comprises a first conductive pattern 24 and the second insulating pattern 34 stacked on the first conductive pattern 24. According to an embodiment, the transfer gate structure 93 partially overlaps the first impurity diffused region 75.

According to an embodiment, the transfer gate structure 93 is formed adjacent to the first impurity diffused region 75 and is aligned with the first impurity diffused region 75. The logic gate structure 96 comprises a first conductive pattern 28. The capacitor structure 99 comprises a first conductive pattern 26, the second insulating pattern 36 and the second conductive pattern 46, which are sequentially stacked.

The first conductive pattern 26 functions as a lower electrode to the capacitor structure S6. Subsequently, the third photoresist patterns 84 are removed from the semiconductor substrate 2.

Figure 8:
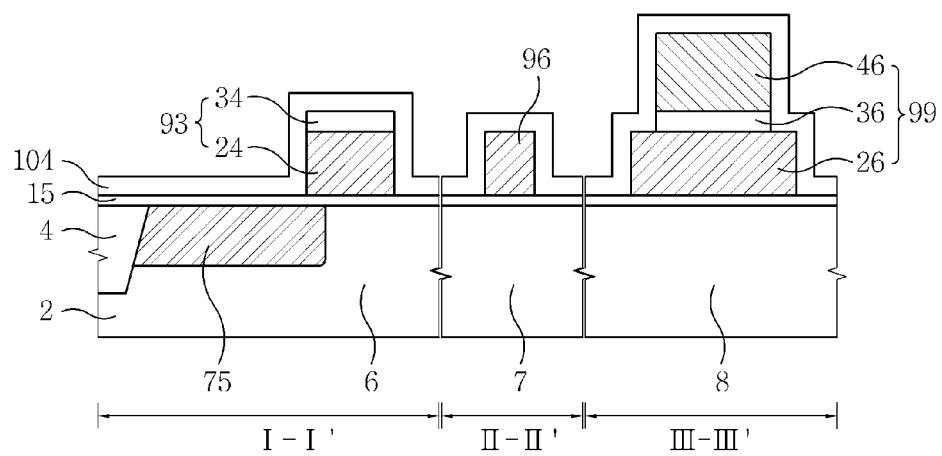

Referring to FIG. 8, a third insulating film 104 is formed on the first insulating film 15 to cover the transfer gate structure 93, the logic gate structure 96 and the capacitor structure 99. According to an embodiment, the third insulating film 104 conformally covers the transfer gate structure 93, the logic gate structure 96 and the capacitor structure 99. The third insulating film 104 comprises, for example, insulating material having a different etching rate from the first insulating film 15, such as silicon nitride or silicon oxynitride.

Figure 9:
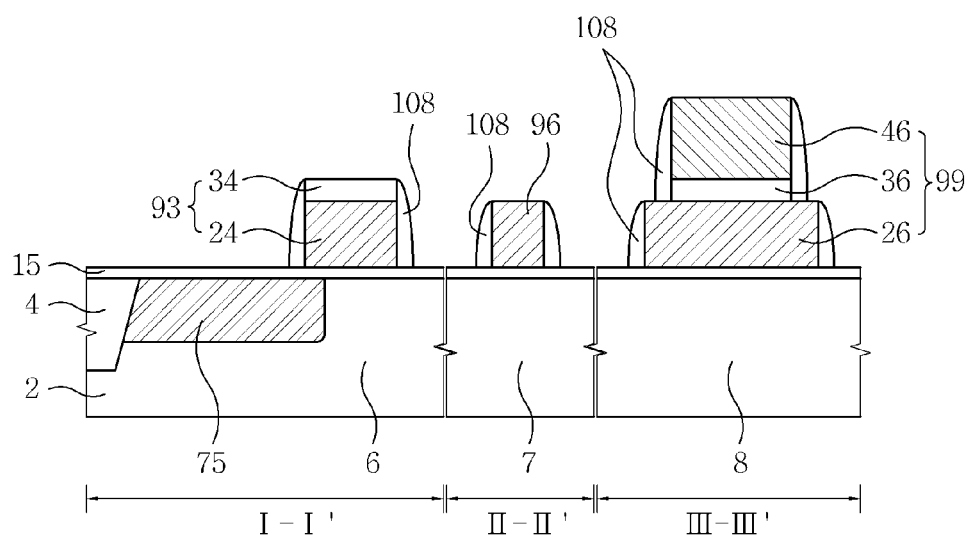

Referring to FIG. 9, the third insulating film 104 is etched to form spacers 108. The first insulating film 15 is used as an etch buffer layer, together with the transfer gate structure 93, the logic gate structure 96 and the capacitor structure 99. The spacers 108 cover sidewalls of the transfer gate structure 93, the logic gate structure 96 and the capacitor structure 99.

Figure 10:
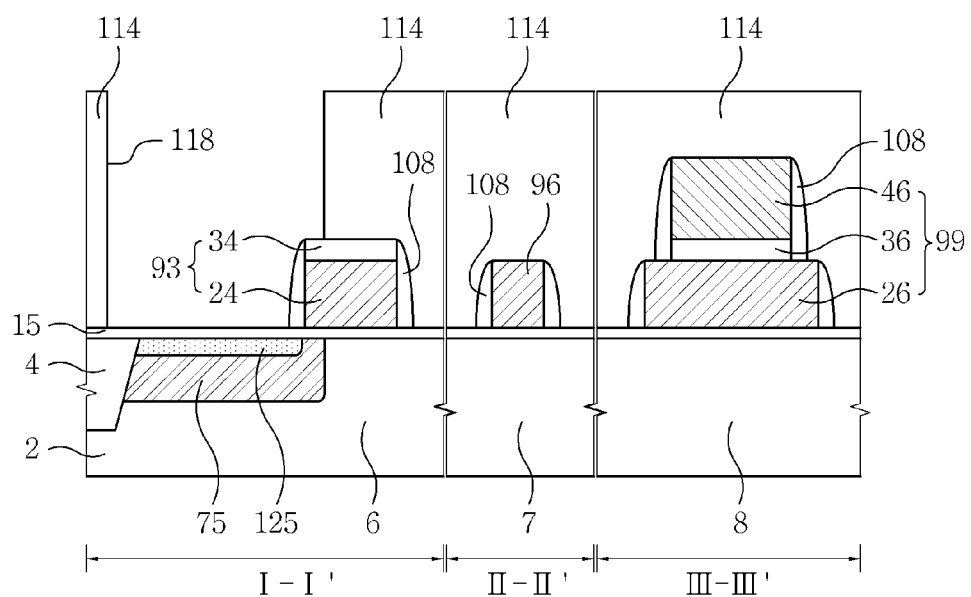

Referring to FIG. 10, a fourth photoresist pattern 114 is formed on the first insulating film 15, the transfer gate structure 93, the logic gate structure 96 and the capacitor structure 99. According to an embodiment, the fourth photoresist pattern 114 has the same shape as or a similar shape to the second photoresist pattern 63 of FIG. 5. Accordingly, the fourth photoresist pattern 114 has an opening 118 on the first active region 6.

According to an embodiment, when viewed from a plan view, an exposure area of the opening 118 of the fourth photoresist pattern 114 has the same size as or a larger size than the opening 66 of the second photoresist pattern 63 of FIG. 5. The opening 118 of the fourth photoresist pattern 114 exposes the first insulating film 15, the transfer gate structure 93, and a spacer 108 of the first active region 6.

Impurity ions are implanted in the semiconductor substrate 2 through the first insulating film 15 using the fourth photoresist pattern 114 as a mask. For example, the impurity ions may comprise boron (B). As a result, a second impurity diffused region 125 is formed in the semiconductor substrate 2. According to an embodiment, the second impurity diffused region 125 has a different conductivity from the first impurity diffused region 75.

According to an embodiment, the first impurity diffused region 75 has an n-type conductivity, and the second impurity diffused region 125 has a p-type conductivity. The second impurity diffused region 125 is formed in the first impurity diffused region 75. After the forming of the second impurity diffused region 125, the fourth photoresist pattern 114 is removed from the semiconductor substrate 2.

Figure 11:
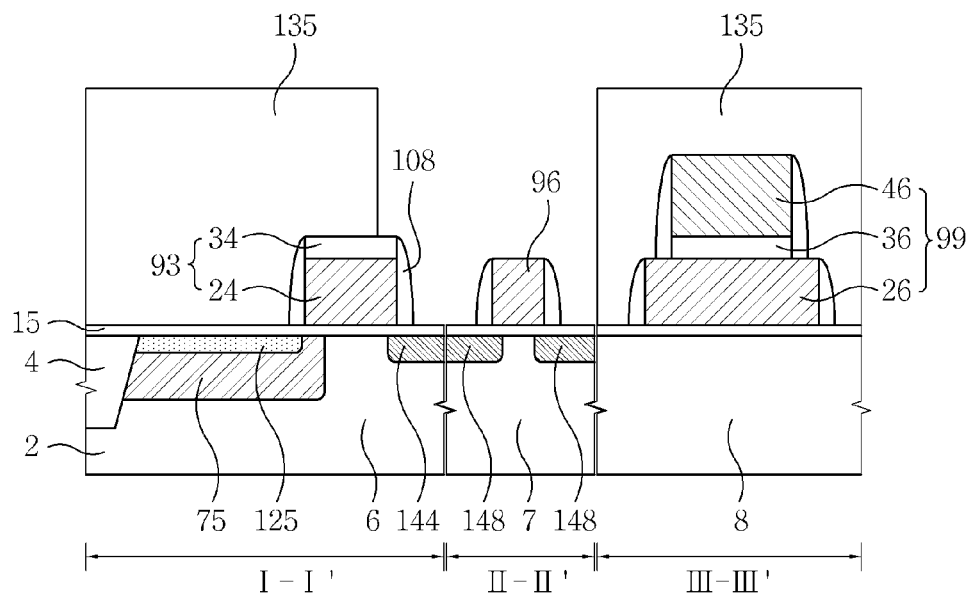

Referring to FIG. 11, fifth photoresist patterns 135 are formed on the first insulating film 15, the transfer gate structure 93 and the capacitor structure 99. A fifth photoresist pattern 135 of the first active region 6 exposes part of the transfer gate structure 93, and a spacer 108 disposed on a sidewall of the transfer gate structure 93. The fifth photoresist patterns 135 expose the logic gate structure 96 and spacers 108 disposed on sidewalls of the logic gate structure 96.

A fifth photoresist pattern 135 of the third active region 8 covers the capacitor structure 99. Impurity ions are implanted in the semiconductor substrate 2 through the first insulating film 15 using the fifth photoresist patterns 135 as a mask. For example, the impurity ions may comprise phosphorus (P) or Arsenic (As). As a result, third impurity diffused regions 144 and 148 are formed in the semiconductor substrate 2.

According to an embodiment, the third impurity diffused regions 144 and 148 have the same conductivity as the first impurity diffused region 75. According to an embodiment, the first impurity diffused region 75 corresponds to source and drain regions of transistors together with the second and third impurity diffused regions 125, 144 and 148.

Figure 12:
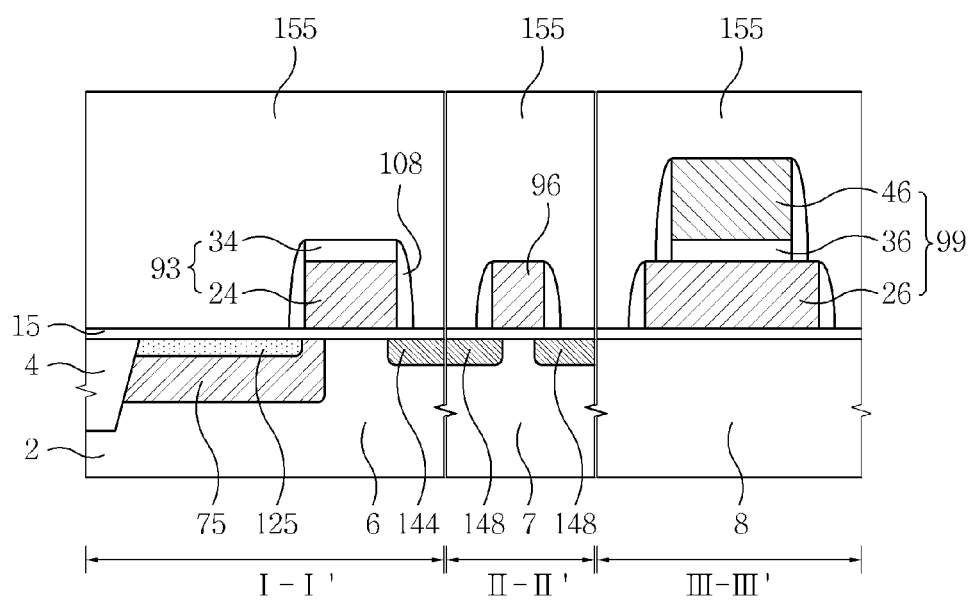

Referring to FIG. 12, after forming the third impurity diffused regions 144 and 148, the fifth photoresist patterns 135 are removed from the semiconductor substrate 2. Subsequently, a fourth insulating film 155 is formed on the first insulating film 15 to cover the transfer gate structure 93, the logic gate structure 96 and the capacitor structure 99. The fourth insulating film 155 may comprise undoped silicon oxide or doped silicon oxide.

FIGS. 13 to 19 are cross-sectional views taken along lines I-I', II-II' and III-III' of FIG. 2, illustrating a method of forming an image sensor according to an embodiment of the inventive concept. FIGS. 13 to 19 use like reference numerals for like members as shown in FIGS. 3 to 12.

Figure 13:
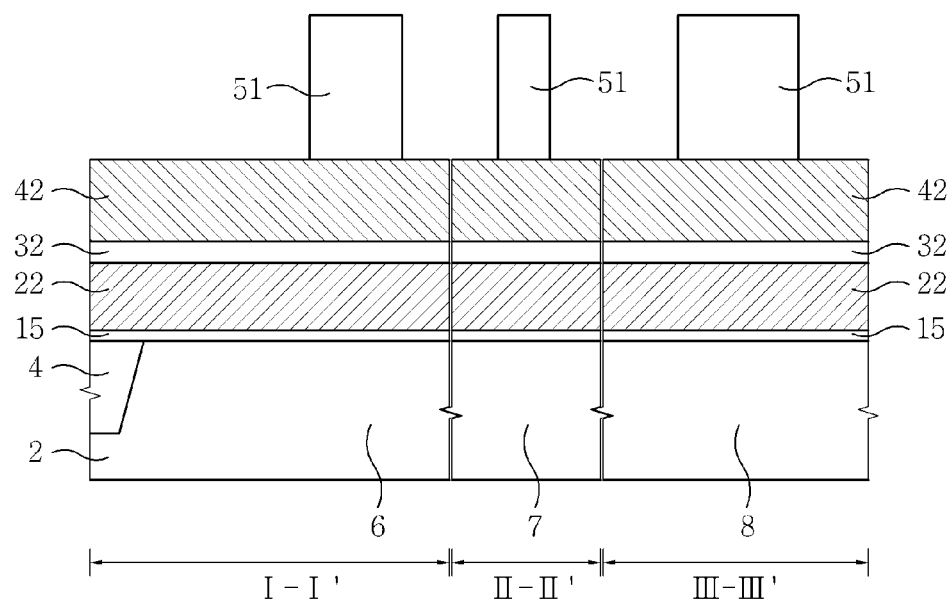
FIGS. 13 to 19 are cross-sectional views taken along lines I-I', II-II' and III-III' of FIG. 2, illustrating a method of forming an image sensor according to an embodiment of the inventive concept.

Referring to FIG. 13, the first insulating film 15, the first conductive film 22, the second insulating film 32 and the second conductive film 42 sequentially stacked on the semiconductor substrate 2, are prepared like those shown in FIG. 3. First photoresist patterns 51 are formed on the first to third active regions 6, 7 and 8, respectively.

According to embodiments, a first photoresist pattern 51 of the first active region 6 may or may not be formed to correspond each of the reset, sensing and access gate structures S2, S3 and S4 of FIG. 2. In comparison with FIG. 3, which does not include a first photoresist pattern 51 on the second active region 7, FIG. 13 includes a first photoresist pattern 51 formed on the second active region 7.

Figure 14:
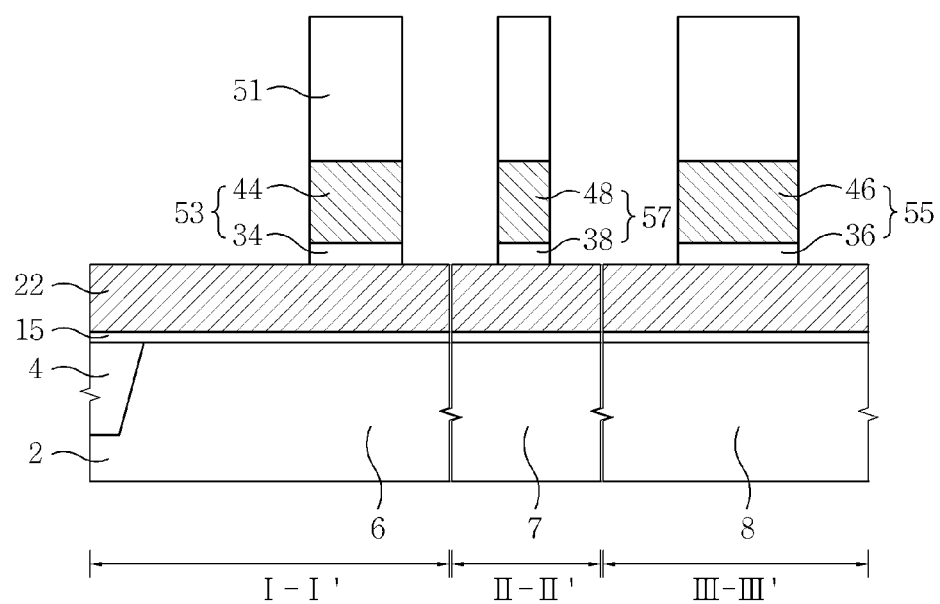

Referring to FIG. 14, the second insulating film 32 and the second conductive film 42 of FIG. 13 are etched using the first photoresist patterns 51 as an etch mask to expose the first conductive film 22. According to an embodiment, the second insulating film 32 and the second conductive film 42 of FIG. 13 are etched in the same manner as in FIG. 4. As a result, first to third structures 53, 55 and 57 are formed on the first conductive film 22.

The first and third structures 53 and 55 may have the same shape as in FIG. 4. The third structure 57 comprises a second insulating pattern 38 and a second conductive pattern 48 on the second active region 7. The first to third structures 53, 55 and 57 correspond to the transfer gate structure S1, the capacitor structure S6 and the logic gate structure S5 of FIG. 2, respectively.

Figure 15:
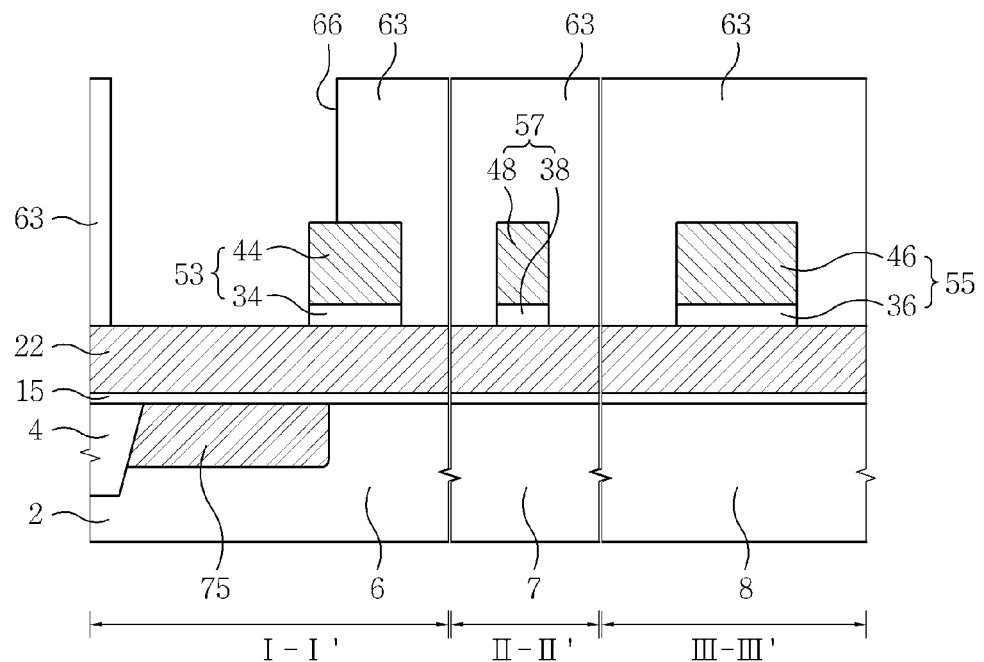

Referring to FIG. 15, after the forming of the first to third structures 53, 55 and 57, the first photoresist patterns 51 are removed from the semiconductor substrate 2. A second photoresist pattern 63 like that shown in FIG. 5 is formed on the first conductive film, and the first to third structures 53, 55 and 57. The second photoresist pattern 63 includes the opening 66 therein.

The opening 66 of the second photoresist pattern 63 exposes the first conductive film 22 and the first structure 53. Impurity ions are implanted in the semiconductor substrate 2 through the first insulating film 15 and the first conductive film 22 using the first structure 53 and the second photoresist pattern 63 as a mask. As a result, a first impurity diffused region 75 is formed in the semiconductor substrate 2. The first impurity diffused region 75 aligns with the first structure 53.

Figure 16:
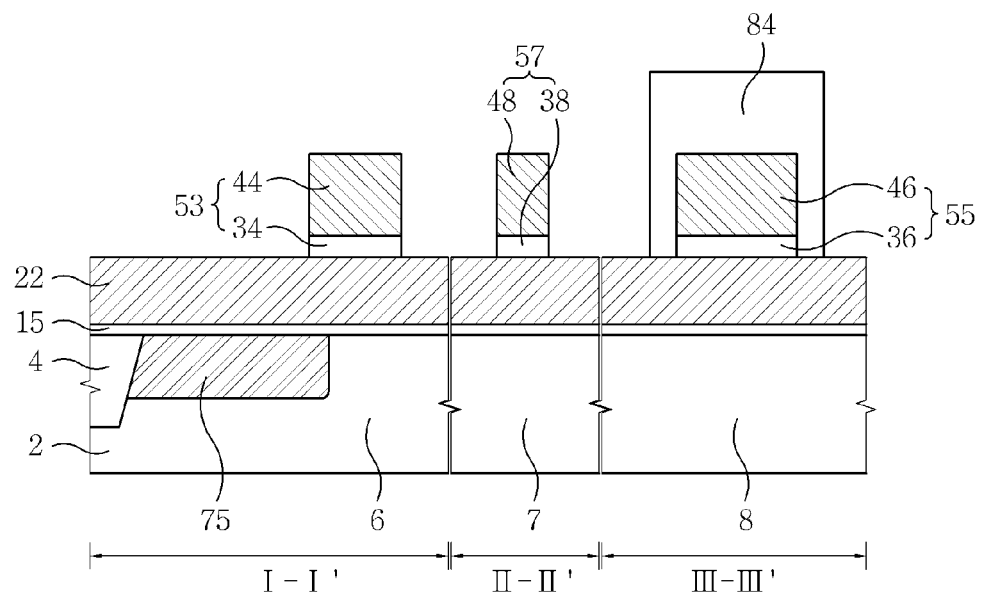

Referring to FIG. 16, after forming the first impurity diffused region 75, the second photoresist pattern 63 is removed from the semiconductor substrate 2. A third photoresist pattern 84 is formed on the second structure 55. According to an embodiment, the third photoresist pattern 84 surrounds the second structure 55 on the third active region 8.

Figure 17:
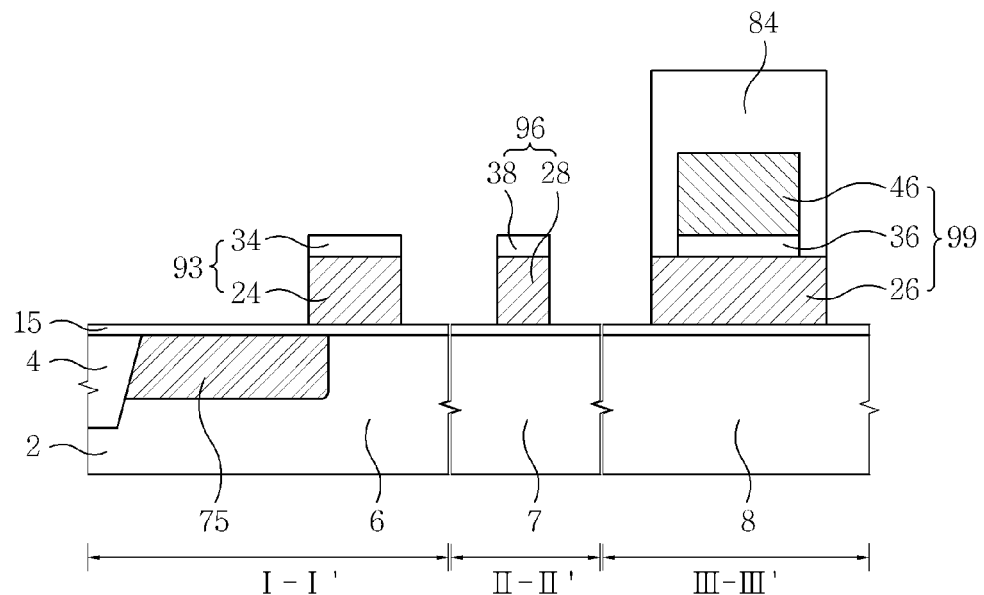

Referring to FIG. 17, the first conductive film 22 of FIG. 16 is etched using the first insulating film 15 and the third photoresist pattern 84 as an etch buffer layer and an etch mask respectively. During the etching of the first conductive film 22, the second conductive patterns 44 and 48 are etched using the second insulating patterns 34 and 38 as etch buffer layers.

During the etching of the first conductive film 22 and the second conductive patterns 44 and 48, the second insulating patterns 34 and 38 stabilize a process environment of the etching process to improve pattern fidelity. As a result, a transfer gate structure 93, a logic gate structure 96 and a capacitor structure 99 are formed on the first to third active regions 6, 7 and 8, respectively, as shown in FIG. 18.

According to an embodiment, the transfer gate structure 93 and the capacitor structure 99 have the same shape as in FIG. 7. According to an embodiment, the transfer gate structure 93 partially overlaps the first impurity diffused region 75. The transfer gate structure 93 is formed adjacent to the first impurity diffused region 75 to align with the first impurity diffused region 75. Unlike FIG. 7, the logic gate structure 96 comprises a first conductive pattern 28 and a second insulating pattern 38 stacked thereon.

Figure 18:
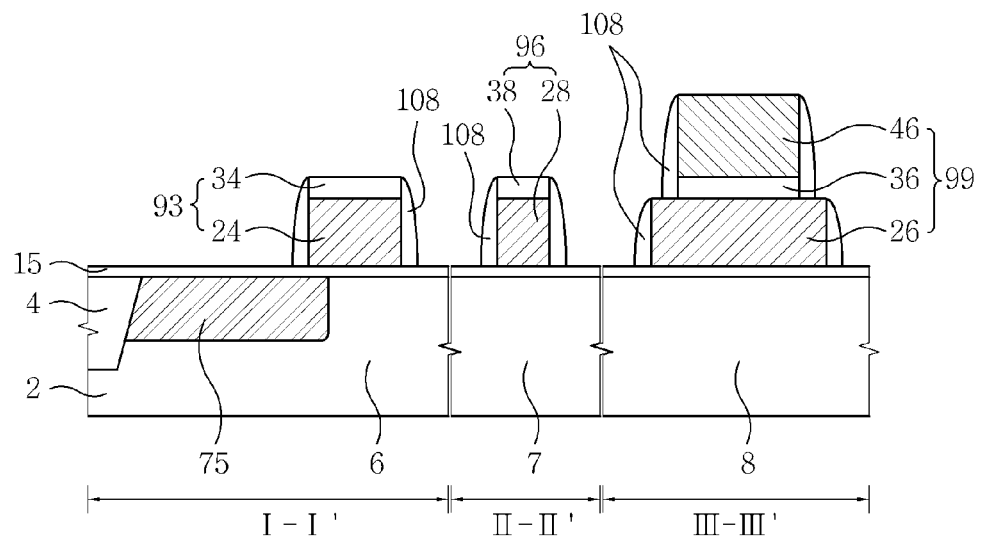

Referring to FIG. 18, spacers 108 are formed on the first insulating film 15 in the same manner as in FIGS. 8 and 9. The spacers 108 are formed on sidewalls of the transfer gate structure 93, the logic gate structure 96 and the capacitor structure 99.

Figure 19:
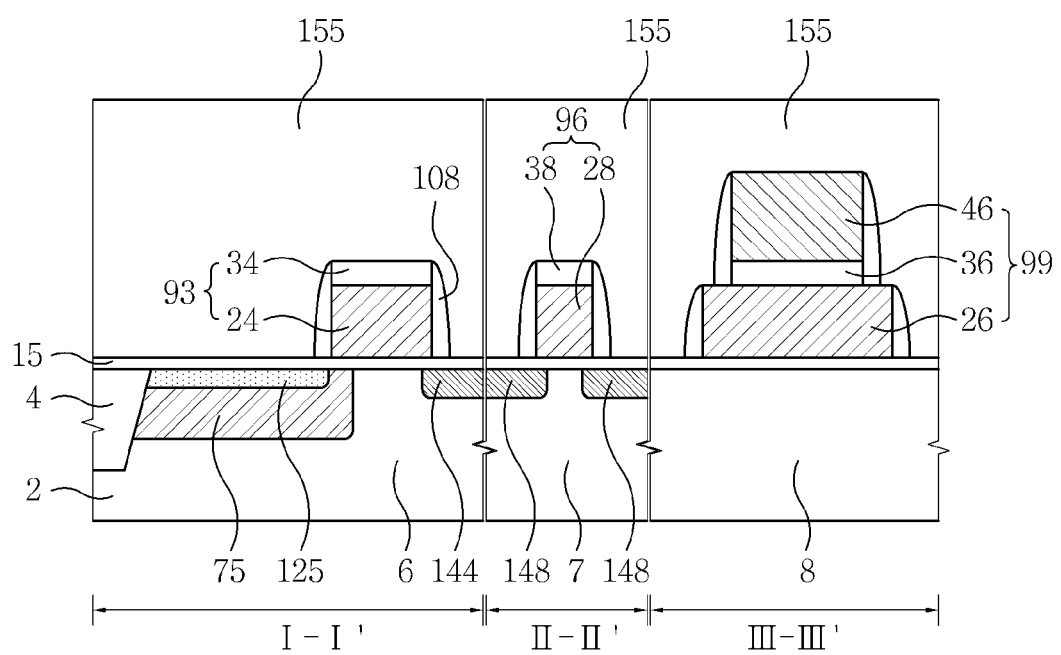

Referring to FIG. 19, second and third impurity diffused regions 125, 144 and 148 are formed in the semiconductor substrate 2 in the same manner as in FIGS. 10 and 11. Subsequently, a fourth insulating film 155 is formed on the semiconductor substrate 2 in the same manner as in FIG. 12.

Figure 20:
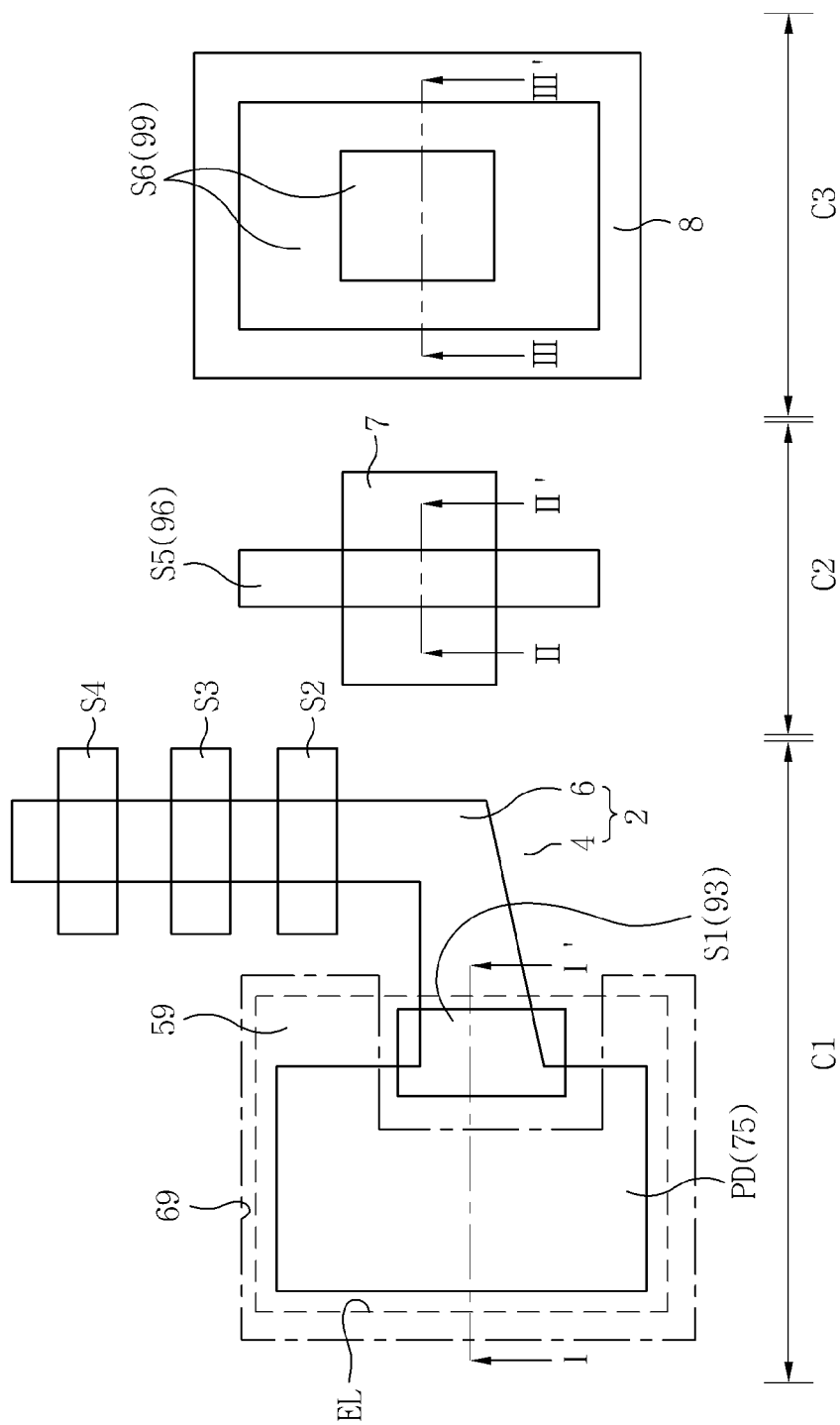
FIG. 20 is an enlarged view showing the check regions C1, C2 and C3 of FIG. 1 according to example embodiments of the inventive concept.

Methods of forming an image sensor according to embodiments of the inventive concept are illustrated by referring to FIGS. 20 to 34. FIG. 20 shows an image sensor including a similar structure to FIG. 2. However, FIGS. 21 to 34 disclose a method of forming a photodiode and a transfer gate structure different from that described in connection with FIGS. 3 to 19.

FIG. 20 is an enlarged view showing check regions C1, C2 and C3 like those shown in FIG. 1 according to example embodiments of the inventive concept. FIGS. 21 to 27 are cross-sectional views taken along lines I-I', II-II' and III-III' of FIG. 20, for illustrating a method of forming an image sensor according to an embodiment of the inventive concept. FIGS. 21 to 27 use like reference numerals for like members to those shown in FIGS. 3 to 12.

Figure 21:
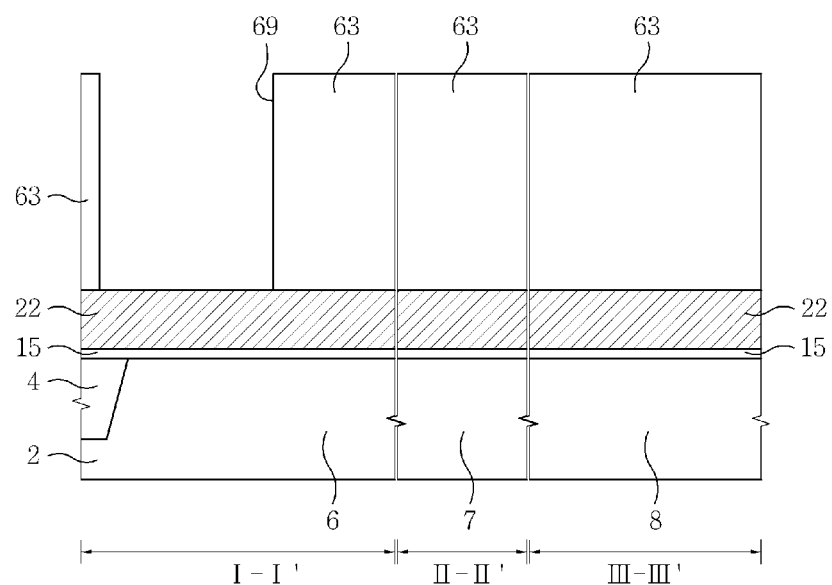
FIGS. 21 to 27 are cross-sectional views taken along lines I-I', II-II' and III-III' of FIG. 20, illustrating a method of forming an image sensor according to an embodiment of the inventive concept.

Referring to FIG. 21, a first insulating film 15 and a first conductive film 22 sequentially stacked on a semiconductor substrate 2 are formed like the first insulating film 15 and the first conductive film 22 shown in FIG. 3. A first photoresist pattern 63 is formed on the first conductive film 22. The first photoresist pattern 63 includes an opening 69 on a first active region 6. According to an embodiment, an exposure area of the opening 69 of the first photoresist pattern 63 has a smaller size than that of the first photoresist pattern 63 of FIG. 5.

The first photoresist pattern 63 is formed to cover an occupied area of a transfer gate structure S1 of FIG. 20. In further detail, the first photoresist pattern 63 protrudes toward a photodiode 75 as much as the occupied area of the transfer gate structure S1 of FIG. 20.

According to an embodiment, the opening 69 of the first photoresist pattern 63 has an exposure area having a different size from that of the opening 66 of FIGS. 2 and 5. For example, the opening 69 may have a larger exposure area than the opening 66.

Figure 22:
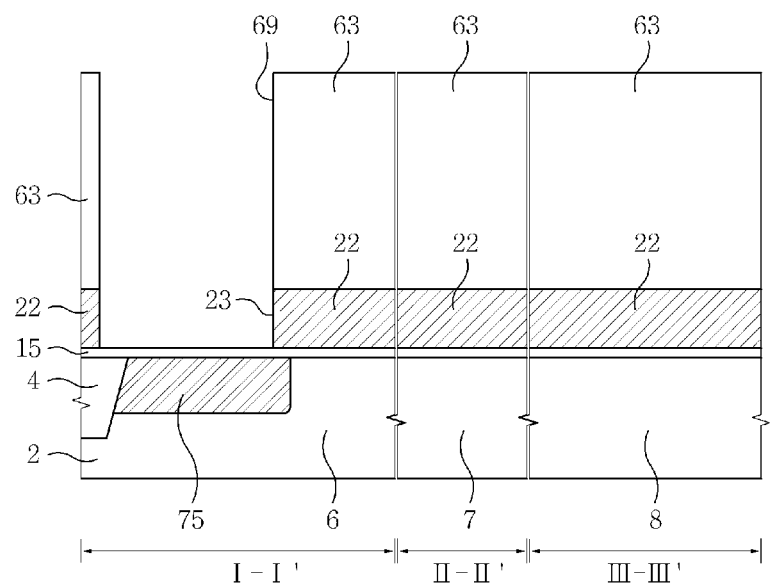

Referring to FIG. 22, the first conductive film 22 of FIG. 21 is etched using the first insulating film 15 and the first photoresist pattern 63 as an etch buffer layer and an etch mask, respectively. As a result, the first conductive film 22 includes a through hole 23 exposing the first insulating film 15 on the first active region 6. The through hole 23 of the first conductive film 22 has the same exposure area as the opening 69 of the first photoresist pattern 63.

Impurity ions are implanted in the semiconductor substrate 2 through the first insulating film 15 and the through hole 23, and the first photoresist pattern 63 is used as a mask. As a result, a first impurity diffused region 75 is formed in the semiconductor substrate 2. The first impurity diffused region 75 is self-aligned with the through hole 23 of the first conductive film 22. Subsequently, the first photoresist pattern 63 is removed from the semiconductor substrate 2.

Figure 23:
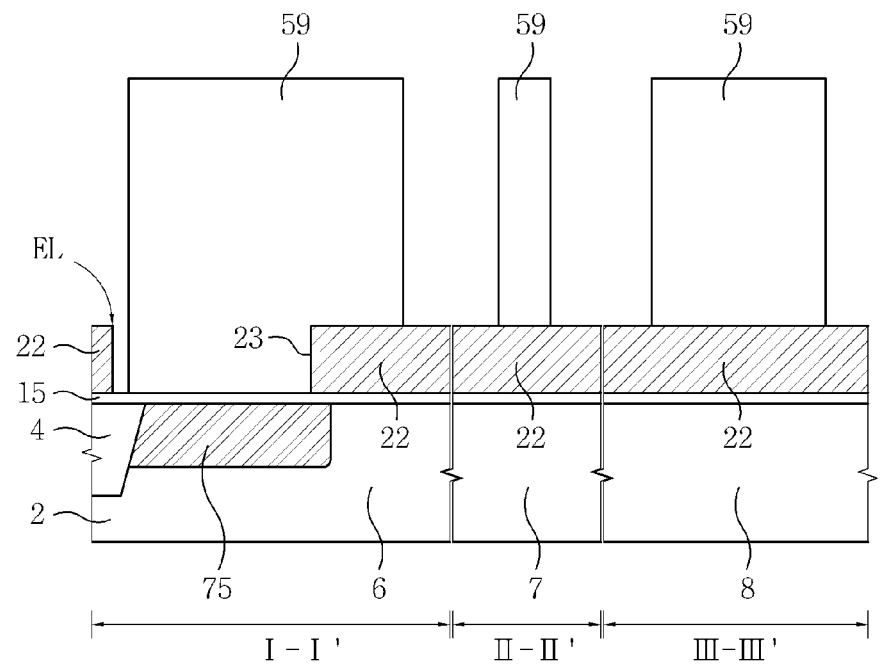

Referring to FIG. 23, second photoresist patterns 59 are formed on the first insulating film 15 and the first conductive film 22. The second photoresist patterns 59 are formed on the first to third active regions 6, 7 and 8, respectively. According to an embodiment, a second photoresist pattern 59 of the first active region 6 partially fills the through hole 23 of the first conductive film 22.

For example, referring to FIGS. 20 and 23, the second photoresist pattern 59 of the first active region 6 exposes a top surface and/or a sidewall of the first conductive film 22 along an edge line EL not intersecting the transfer gate structure S1. Second photoresist patterns 59 of the second and third active regions 7 and 8 expose portions of the first conductive film 22. The second photoresist patterns 59 correspond to the transfer gate structure S1, a logic gate structure S5, and a capacitor structure S6 of FIG. 20. Alternatively, the second photoresist pattern 59 of the first active region 6 fills the through hole 23 to expose the top surface of the first conductive film 22 without exposing a sidewall of the first conductive film 22.

Figure 24:
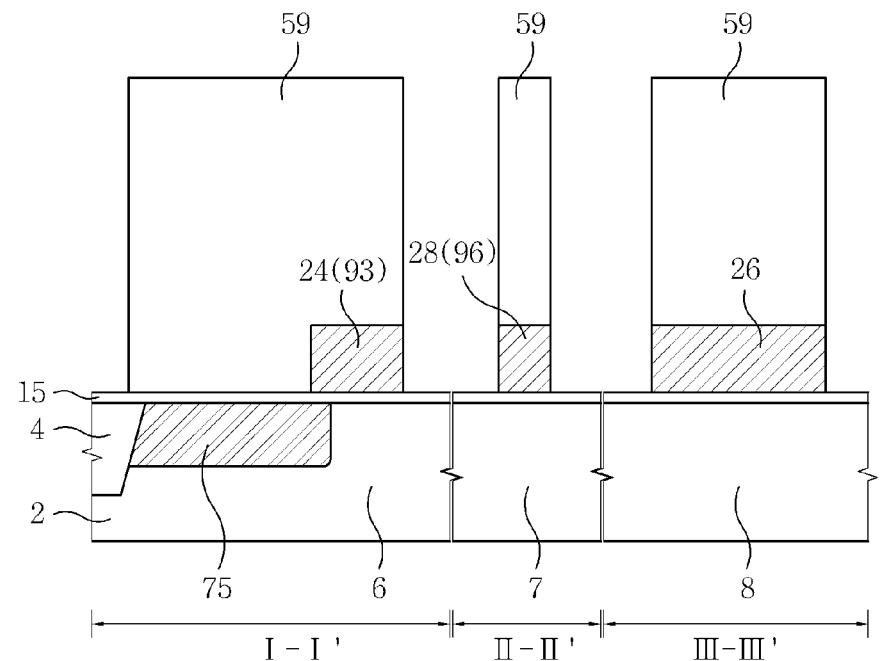

Referring to FIG. 24, the first conductive film 22 of FIG. 23 is etched using the first insulating film 15 and the second photoresist patterns 59 as an etch buffer layer and an etch mask, respectively. As a result, first conductive patterns 24, 26 and 28 are formed on the first to third active regions 6, 7 and 8, respectively. Referring to FIGS. 20 and 24, a first conductive pattern 24 of the first active region 6 constitutes a transfer gate structure 93.

According to an embodiment, the transfer gate structure 93 partially overlaps the first impurity diffused region 75. The transfer gate structure 93 is formed adjacent to the first impurity diffused region 75 to align with the first impurity diffused region 75. Referring to FIGS. 20 and 24, a first conductive pattern 28 of the second active region 7 constitutes a logic gate structure 96. A first conductive pattern 26 of the third active region 8 functions as a lower electrode of the capacitor structure S6.

Figure 25:
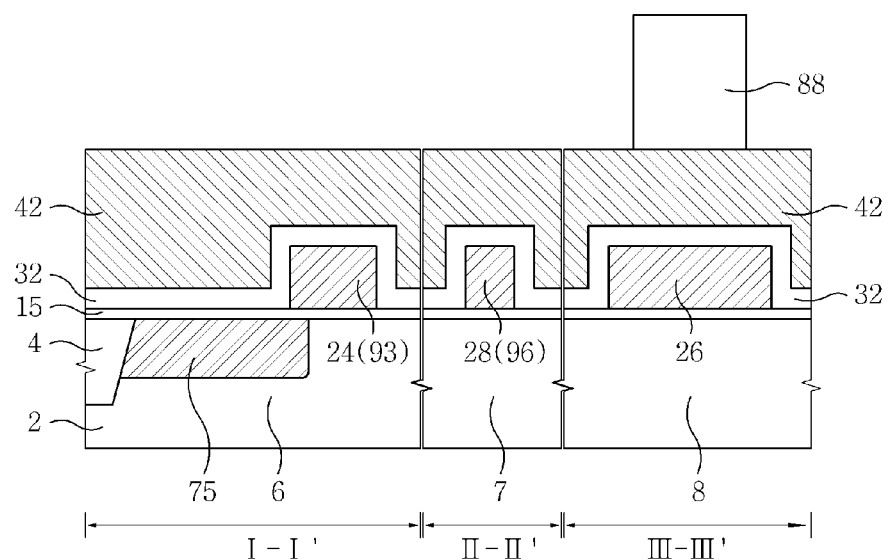

Referring to FIG. 25, after the forming of the first conductive patterns 24, 26 and 28, the second photoresist patterns 59 are removed from the semiconductor substrate 2. A second insulating film 32 and a second conductive film 42 are sequentially formed on the semiconductor substrate 2 to cover the first conductive patterns 24, 26 and 28. The second insulating film 32 conformably covers the first conductive patterns 24, 26 and 28.

The second conductive film 42 is formed on the second insulating film 32 and fills in areas between the first conductive patterns 24, 26 and 28. A third photoresist pattern 88 is formed on the second conductive film 42. The third photoresist pattern 88 on the third active region 8 leaves exposed part of the second conductive film 42. The third photoresist pattern 88 corresponds to the capacitor structure S6 of FIG. 20.

Figure 26:
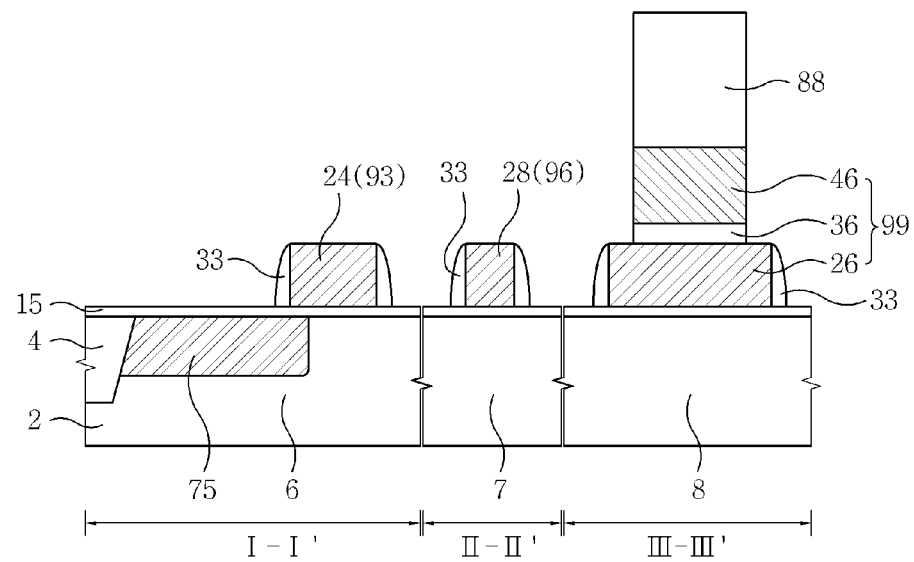

Referring to FIG. 26, the second insulating film 32 and the second conductive film 42 of FIG. 25 are etched using the third photoresist pattern 88 as an etch mask. During the etching of the second conductive film 42, the second insulating film 32 is used as an etch buffer layer. During the etching of the second insulating film 32, the first insulating film 15 and the first conductive patterns 24, 26 and 28 are used as etch buffer layers.

As a result, a second insulating pattern 36 and a second conductive pattern 46 are formed on the first conductive pattern 26 of the third active region 8. Referring to FIGS. 20 and 26, the first conductive pattern 26, the second insulating pattern 36 and the second conductive pattern 46 constitute a capacitor structure 99. In addition, while forming the capacitor structure 99, spacers 33 are formed on the first insulating film 15.

The spacers 33 are formed using the second insulating film 32. According to an embodiment, the spacers 33 are formed on sidewalls of the first conductive patterns 24, 26 and 28. Alternatively, the spacers 33 are not formed on the sidewalls of the first conductive patterns 24, 26 and 28.

Figure 27:
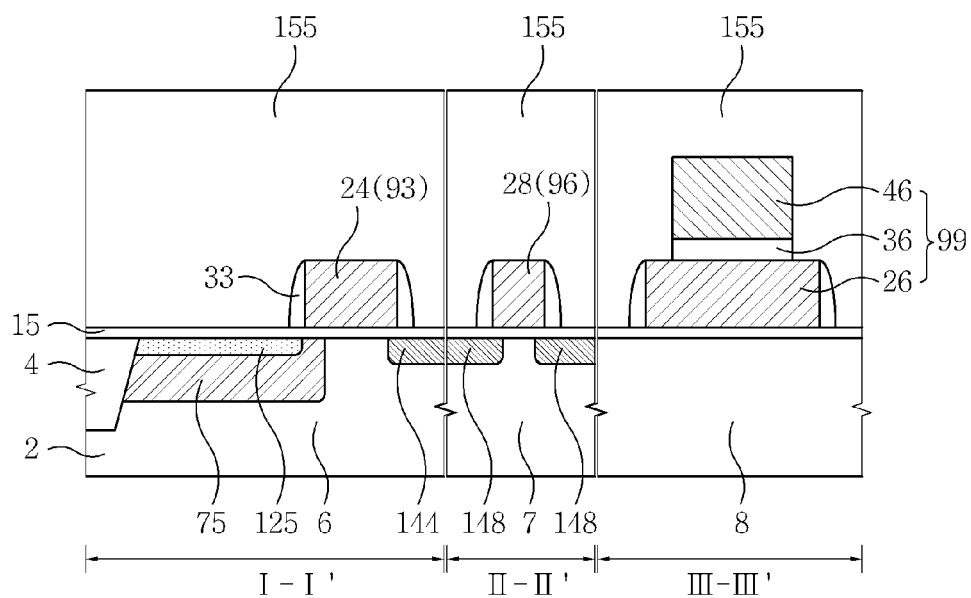

Referring to FIG. 27, after forming the spacers 33, the second insulating pattern 36 and the second conductive pattern 46, the third photoresist pattern 88 is removed from the semiconductor substrate 2. A second impurity diffused region 125 and third impurity diffused regions 144 and 148 are formed in the semiconductor substrate 2. Subsequently, a fourth insulating film 155 is formed on the semiconductor substrate 2.

FIGS. 28 to 34 are cross-sectional views taken along lines II-II', II-II' and III-III' of FIG. 20, and illustrate a method of forming an image sensor according to an embodiment of the inventive concept. In this case, FIGS. 28 to 34 use like reference numerals for like members as shown in FIGS. 3 to 12.

Figure 28:
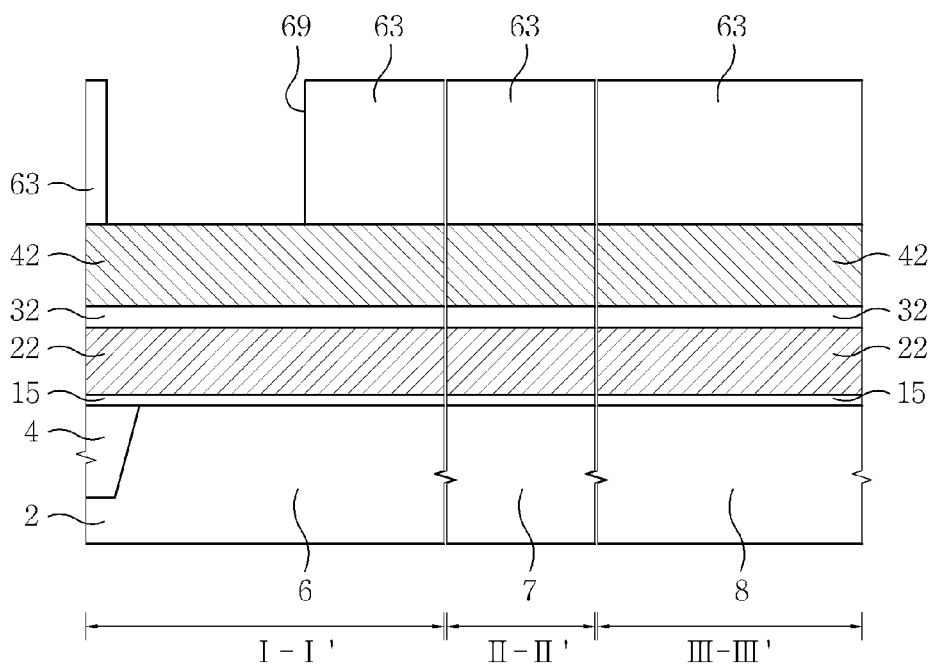
FIGS. 28 to 34 are cross-sectional views taken along lines I-I', II-II' and III-III' of FIG. 20, illustrating a method of forming an image sensor according to an embodiment of the inventive concept.

Referring to FIG. 28, a first insulating film 15, a first conductive film 22, a second insulating film 32 and a second conductive film 42 are sequentially formed on a semiconductor substrate 2. A first photoresist pattern 63 is formed on the second conductive film 42. The first photoresist pattern 63 has the same or a similar shape to the photoresist pattern 63 shown in FIG. 21. The first photoresist pattern 63 includes an opening 69 on a first active region 6. The opening 69 of the first photoresist pattern 63 exposes the second conductive film 42.

Figure 29:
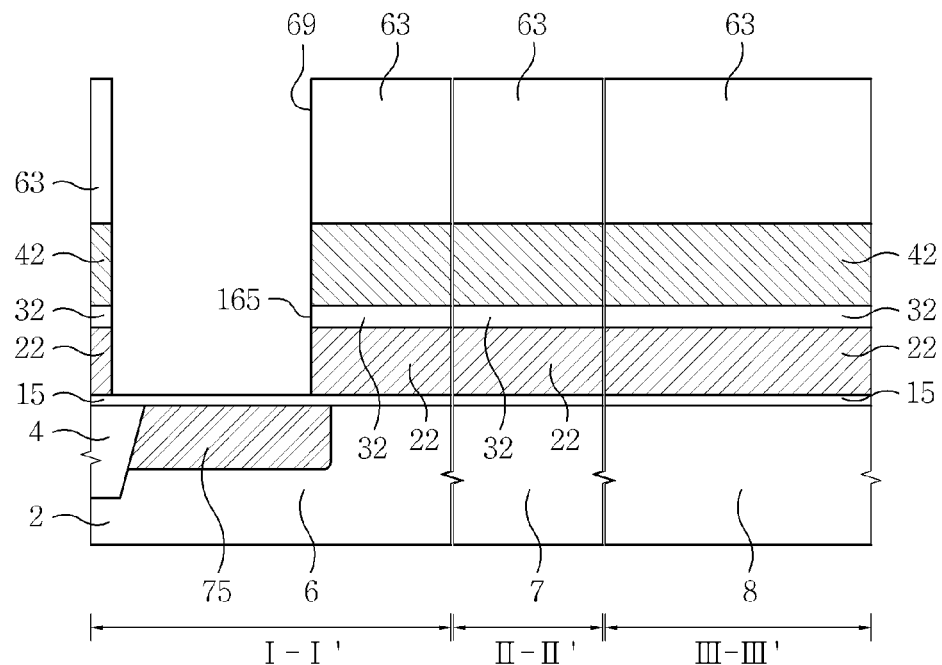

Referring to FIG. 29, the first conductive film 22, the second insulating film 32 and the second conductive film 42 of FIG. 28 are etched using the first photoresist pattern 63 as an etch mask. During the etching of the second conductive film 42, the second insulating film 32 is used as an etch buffer layer. During the etching of the second insulating film 32, the first conductive film 22 is used as an etch buffer layer.

During the etching of the first conductive film 22, the first insulating film 15 is used as an etch buffer layer. As a result, the first conductive film 22, the second insulating film 32 and the second conductive film 42 have a through hole 165 therein. The through hole 165 exposes the first insulating film 15. Impurity ions are implanted in the semiconductor substrate 2 through the first insulating film 15 via the through hole 165, using the first photoresist pattern 63 as a mask.

As a result, a first impurity diffused region 75 is formed in the semiconductor substrate 2. The first impurity diffused region 75 is self-aligned with the through hole 165. Subsequently, the first photoresist pattern 63 is removed from the semiconductor substrate 2.

Figure 30:
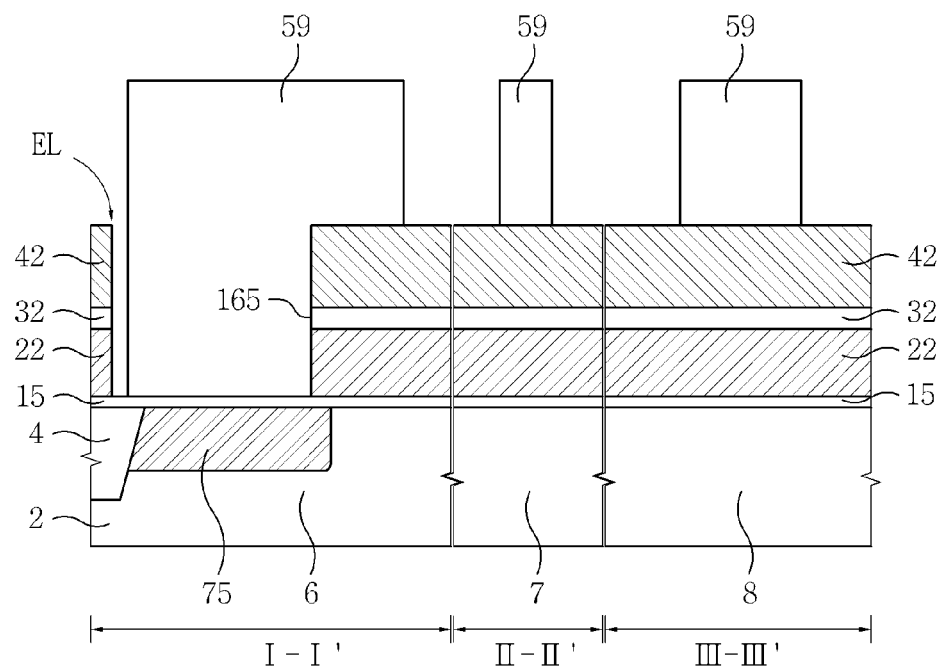

Referring to FIG. 30, second photoresist patterns 59 are formed on the first insulating film 15 and the second conductive film 42. The second photoresist patterns 59 are formed on the first active region 6, a second active region 7 and a third active region 8, respectively. A second photoresist pattern 59 of the first active region 6 partially fills the through hole 165.

The second photoresist pattern 59 of the first active region 6 covers an edge of the through hole 165 to extend onto a top surface of the second conductive film 42. In addition, the second photoresist pattern 59 of the first active region 6 exposes a top surface of the second conductive film 42 and/or sidewalls of the first conductive film 22, the second insulating film 32 and the second conductive film 42 along an edge line EL not intersecting a transfer gate structure S1.

Second photoresist patterns 59 of the second and third active regions 7 and 8 expose portions of the second conductive film 42. The second photoresist patterns 59 correspond to the transfer gate structure S1, a logic gate structure S5, and a capacitor structure S6 of FIG. 20, respectively. Alternatively, the second photoresist pattern 59 fills the through hole 165, so as to expose only the top surface of the second conductive film 42, and not sidewalls of the first conductive film 22, second insulating film 32 and second conductive film 42.

Figure 31:
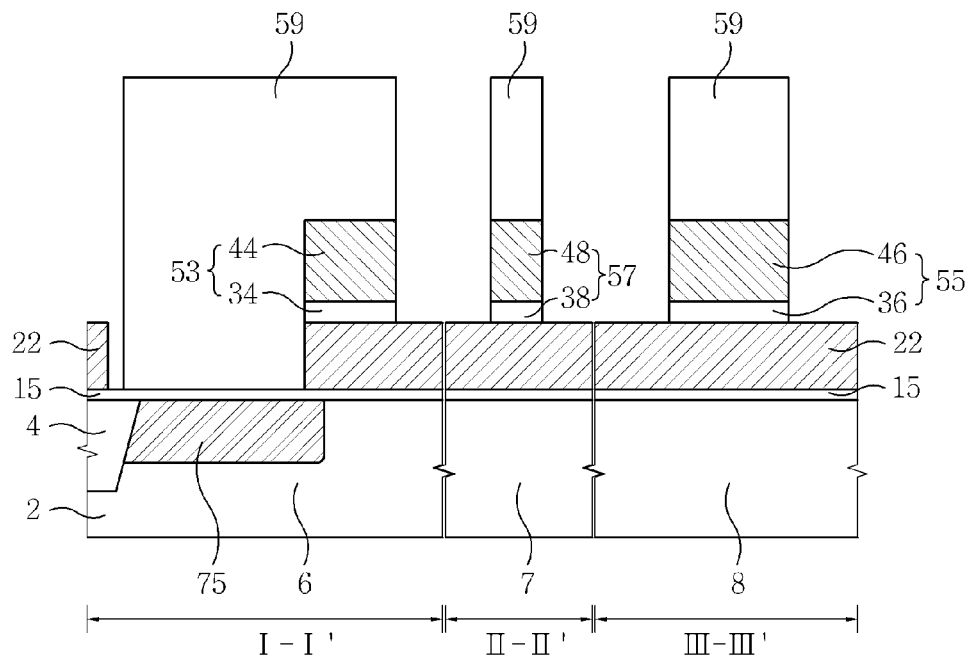

Referring to FIG. 31, the second insulating film 32 and the second conductive film 42 of FIG. 30 are etched using the second photoresist patterns 59 as an etch mask. During the etching of the second conductive film 42, the second insulating film 32 is used as an etch buffer layer. During the etching of the second insulating film 32, the first conductive film 22 is used as an etch buffer layer. As a result, second insulating patterns 34, 36 and 38 and second conductive patterns 44, 46 and 48 are formed on the first conductive film 22.

A second insulating pattern 34 and a second conductive pattern 44 of the first active region 6 constitute a first structure 53. A second insulating pattern 36 and a second conductive pattern 46 of the third active region 8 constitute a second structure 55. A second insulating pattern 38 and a second conductive pattern 48 of the second active region 7 constitute a third structure 57. Subsequently, the second photoresist patterns 59 are removed from the semiconductor substrate 2.

Figure 32:
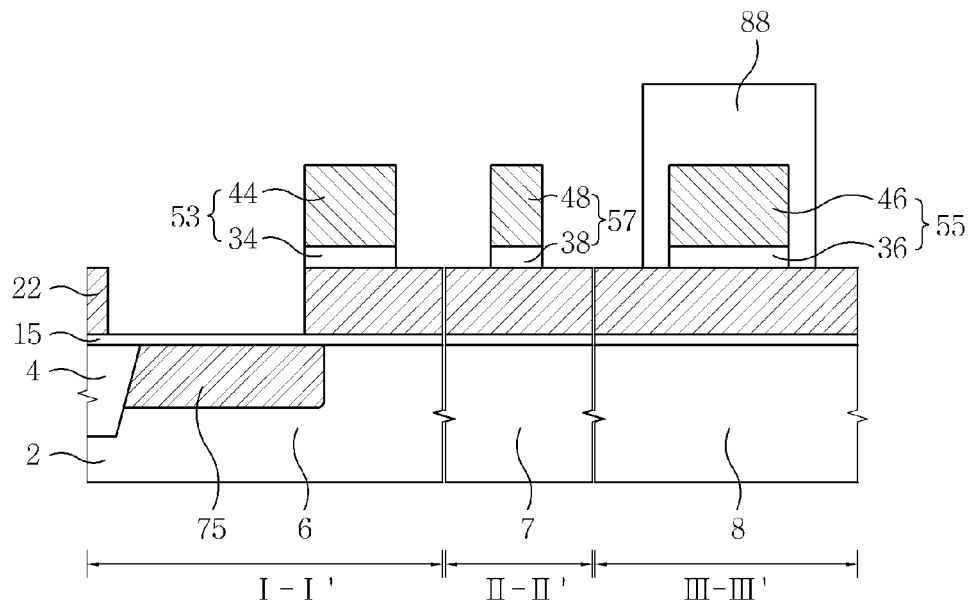

Referring to FIG. 32, a third photoresist pattern 88 is formed on the first conductive film 22 and the second structure 55. According to an embodiment, the third photoresist pattern 88 surrounds the second structure 55 on the third active region 8. The third photoresist pattern 88 leaves part of the first conductive film 22 exposed.

Figure 33:
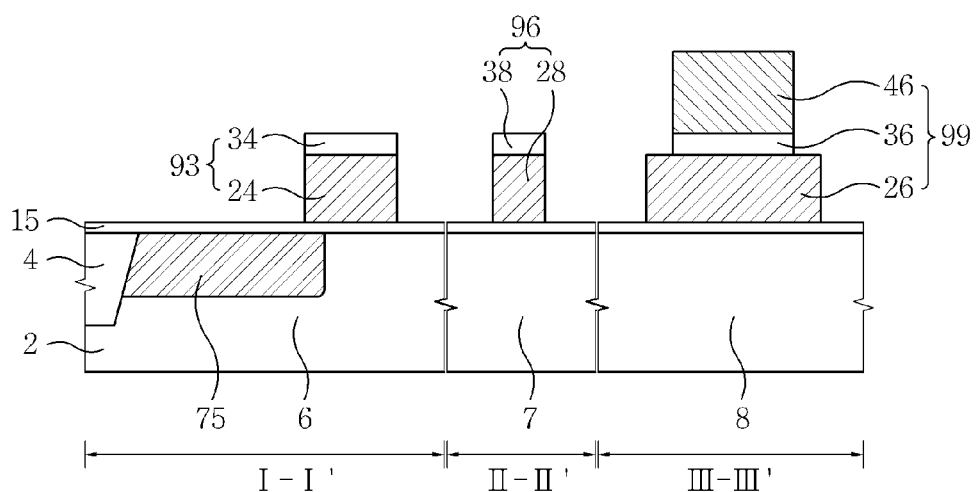

Referring to FIG. 33, the first conductive film 22 of FIG. 32 is etched using the first insulating film 15 and the third photoresist pattern 88 as an etch buffer layer and an etch mask, respectively. During the etching of the first conductive film 22, the second conductive patterns 44 and 48 of FIG. 32 are etched using the second insulating patterns 34 and 38 as etch buffer layers.

As a result, referring to FIGS. 20 and 33, a transfer gate structure 93, a logic gate structure 96 and a capacitor structure 99 are formed on the first to third active regions 6, 7 and 8, respectively. The transfer gate structure 93 comprises a first conductive pattern 24 and the second insulating pattern 34. The transfer gate structure 93 partially overlaps the first impurity diffused region 75.

The transfer gate structure 93 is formed adjacent to the first impurity diffused region 75 to align with the first impurity diffused region 75. The logic gate structure 96 comprises a first conductive pattern 28 and the second insulating pattern 38. The capacitor structure 99 constitutes a first conductive pattern 26, the second insulating patterns 36 and the second conductive pattern 46. Subsequently, the third photoresist pattern 88 is removed from the semiconductor substrate 2.

Figure 34:
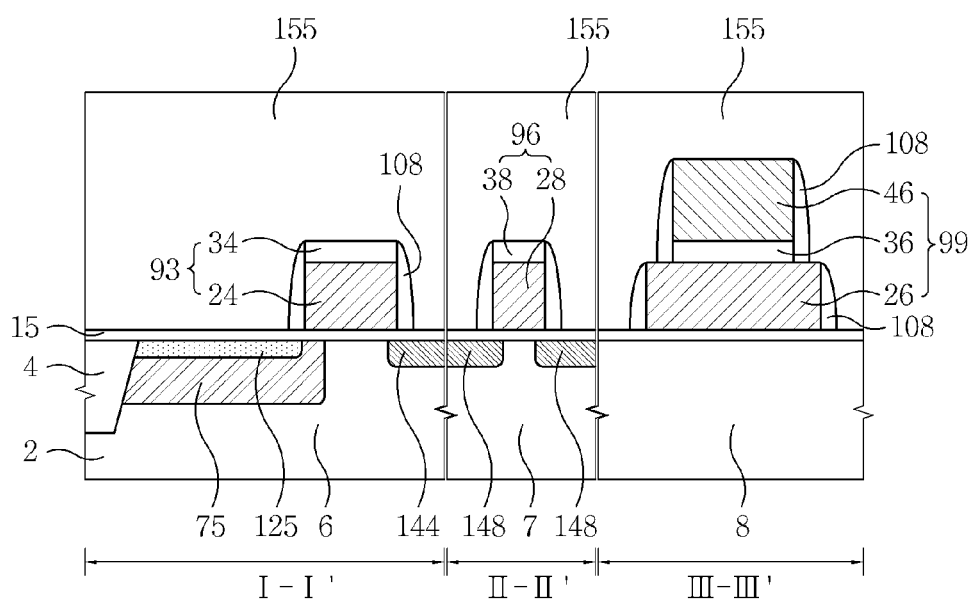

Referring to FIG. 34, spacers 108 are formed on the semiconductor substrate 2. The spacers 108 are formed on sidewalls of the transfer gate structure 93, the logic gate structure 96 and the capacitor structure 99. A second impurity diffused region 125, and third impurity diffused regions 144 and 148 are formed in the semiconductor substrate 2. Subsequently, a fourth insulating layer 155 is formed on the semiconductor substrate 2.

Figure 35:
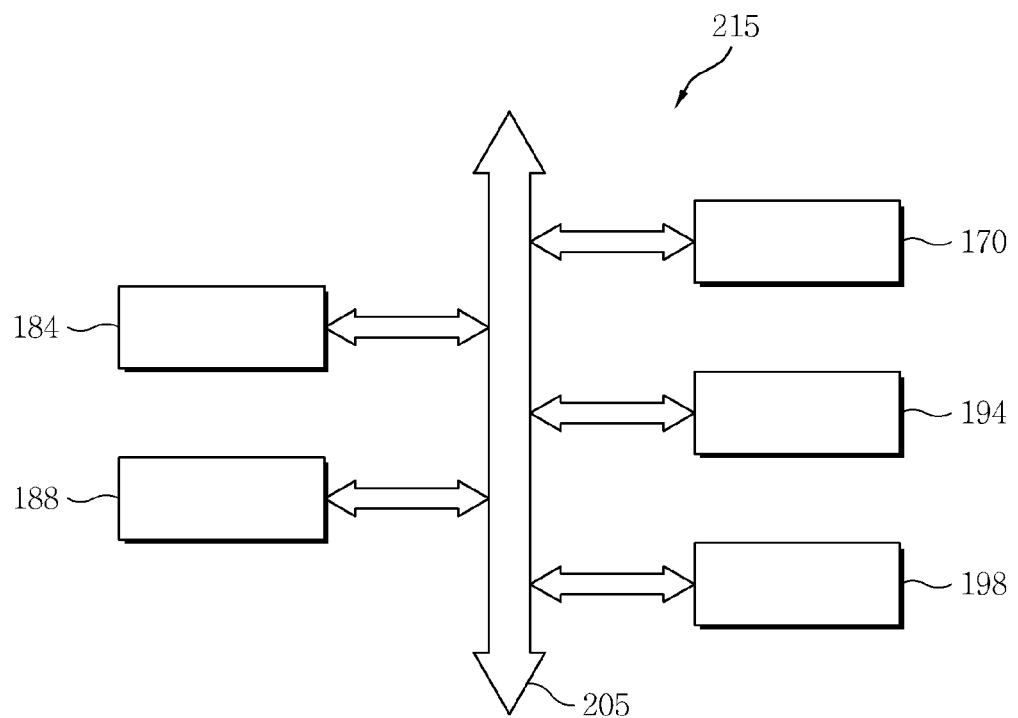
FIG. 35 is a block diagram showing an information processing system including the image sensor of FIG. 1 according to an example embodiment of the inventive concept.

Next, an information processing system according to the inventive concept is described by referring to FIG. 35.

FIG. 35 is a block diagram showing an information processing system including the image sensor of FIG. 1 according to an example embodiment of the inventive concept.

Referring to FIG. 35, an information processing system 215 according to an embodiment of the inventive concept is a camera system. The information processing system 215 comprises a central processing unit (CPU) 184 and a removable memory 188, which are electrically connected with each other through a bus line 205. According to an embodiment, the CPU 184 comprises a microprocessor. According to an embodiment, the removable memory 188 comprises a flash memory.

The information processing system 215 further comprises an image sensor 170, an input/output device 194 and a RAM 198. The image sensor 170, the input/output device 194 and the RAM 198 are electrically connected with the CPU 184 and the removable memory 188 through the bus line 205. The image sensor 170 improves a picture quality of a digital image in the information processing system 215.

Alternatively, the information processing system 215 is a computer system, a scanner, a vehicle navigation system, a video phone, or a data compression system.

As described above, a method of forming a semiconductor device such as an image sensor according to embodiments of the inventive concept includes sequentially forming a photodiode in a semiconductor substrate and gate structures on the semiconductor substrate. As such, the method is used to uniformly generate a process result related to the photodiode and the transfer gate structure.

According to embodiments, the process result comprises a junction profile of the photodiode and a feature size of the transfer gate structure. In addition, an information processing system including the image sensor fabricated according to the embodiments of the inventive concept has an improved picture quality of a digital image.

The foregoing is illustrative of embodiments and is not to be construed as limiting thereof. Although a few embodiments have been described, those skilled in the art will readily appreciate that modifications to the embodiments are possible without materially departing from the novel teachings. Accordingly, all such modifications are intended to be included within the scope of this inventive concept as defined in the claims.

What is claimed is:

1. A method of forming a semiconductor device comprising:
preparing a semiconductor substrate including a first region and a second region;
forming a first insulating film on the semiconductor substrate;
forming a first conductive film on the first insulating film;
forming a first structure on the first conductive film in the first region;
forming a second structure on the first conductive film in the second region;

forming a first mask pattern on the first structure and the second structure, wherein the first mask pattern includes an opening exposing at least part of the first conductive film in the first region;

implanting impurity ions into the semiconductor substrate through the opening using the first mask pattern as a mask, thereby forming an impurity diffused region in the first region of the semiconductor substrate;

removing the first mask pattern from the semiconductor substrate;

forming a second mask pattern on the second structure, leaving part of the first conductive film, and the first structure exposed;

etching the exposed part of the first conductive film, and a portion of the first structure using the second mask pattern as an etch mask to form a gate structure in the first region; and removing the second mask pattern from the semiconductor substrate to form a capacitor structure in the second region.

2. The method of claim 1, wherein the first insulating film includes silicon oxide.

3. The method of claim 1, wherein the first conductive film includes silicon.

4. The method of claim 3, wherein each of the first structure and the second structure includes a second insulating film and a second conductive film sequentially stacked on the first conductive film.

5. The method of claim 4, wherein the second insulating film includes silicon oxide and silicon nitride.

6. The method of claim 4, wherein the second conductive film includes silicon.

7. The method of claim 4, wherein the etching of the portion of the first structure includes removing the second conductive film to leave the second insulating film.

8. The method of claim 1, wherein the first mask pattern further includes a hard mask pattern.

9. The method of claim 8, wherein the hard mask pattern is formed on an upper portion of each of the first structure and the second structure.

10. The method of claim 1, further comprising forming spacers on sidewalls of the gate structure and the capacitor structure.

11. The method of claim 10, wherein the forming the spacers includes,
forming an insulating film covering the gate structure and the capacitor structure; and
etching the insulating film covering the gate structure and the capacitor structure.

12. The method of claim 1, wherein the gate structure is formed of an etched first conductive film, and a remaining portion of the first structure.

13. The method of claim 1, wherein the opening of the first mask pattern exposes a portion of a top surface of the first structure.

14. A method of forming a semiconductor device comprising:
preparing a semiconductor substrate including first, second and third regions;
forming a first insulating film on the semiconductor substrate;
forming a first conductive film on the first insulating film;
forming a first structure on the first conductive film in the first region;
forming a second structure on the first conductive film in the second region;
forming a first mask pattern on the first structure and the second structure, wherein the first mask pattern includes an opening exposing at least part of the first conductive film in the first region;
implanting impurity ions into the semiconductor substrate through the opening using the first mask pattern as a mask, thereby forming an impurity diffused region in the first region, wherein the impurity diffused region is a photodiode of the semiconductor device;
removing the first mask pattern from the semiconductor substrate;
forming a second mask pattern on the second structure, and on a portion of the first conductive film in the third region, leaving part of the first conductive film, and the first structure exposed;
removing the exposed part of the first conductive film, a portion of the first structure and the second mask pattern to form a transfer gate structure on the first region, a capacitor structure on the second region and another gate structure on the third region.

15. The method of claim 14, wherein the first region is an active pixel sensor array region, the second region is a correlated double sampling region, and the third region is a logic region.

16. A method of forming a semiconductor device comprising:
sequentially stacking a first insulating film, a first conductive film, a second insulating film, and a second conductive film on a semiconductor substrate including first and second regions;
forming a first mask pattern on part of the second conductive film in the first and second regions;
removing portions of the second conductive film, and of the second insulating film left exposed by the first mask pattern to form first and second structures on the first and second regions, the first and second structures each including a patterned portion of the second conductive film stacked on a patterned portion of the second insulating film;
removing the first mask pattern;
forming a second mask pattern on the first structure and the second structure, wherein the second mask pattern includes an opening exposing at least part of the first conductive film in the first region;
implanting impurity ions into the semiconductor substrate through the opening using the second mask pattern as a mask, thereby forming an impurity diffused region in the first region of the semiconductor substrate;
removing the second mask pattern from the semiconductor substrate;
forming a third mask pattern on the second structure, leaving part of the first conductive film, and the first structure exposed;
etching the exposed part of the first conductive film, and a portion of the first structure using the third mask pattern as an etch mask to form a gate structure in the first region; and
removing the third mask pattern from the semiconductor substrate to form a capacitor structure in the second region.

17. The method of claim 16, wherein the impurity diffused region is a photodiode of the semiconductor device.

18. The method of claim 16, wherein the etching of the portion of the first structure includes removing the patterned portion of the second conductive film to leave the patterned portion of the second insulating film.

19. The method of claim 16, further comprising:
   forming a third insulating film covering the gate structure and the capacitor structure; and
   etching portions of the third insulating film to form spacers on sidewalls of the gate structure and the capacitor structure.

20. The method of claim 16, wherein the opening of the second mask pattern exposes a portion of a top surface of the first structure.

* * * * *